United States Patent
Noh et al.

(10) Patent No.: US 11,257,925 B2
(45) Date of Patent: Feb. 22, 2022

(54) SEMICONDUCTOR DEVICES HAVING A FIN-SHAPED ACTIVE REGION AND METHODS OF MANUFACTURING THE SAME

(71) Applicant: SAMSUNG ELECTRONICS CO., LTD., Suwon-si (KR)

(72) Inventors: Changwoo Noh, Hwaseong-si (KR); Munhyeon Kim, Hwaseong-si (KR); Hansu Oh, Suwon-si (KR); Sungman Whang, Yongin-si (KR); Dongwon Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/836,138

(22) Filed: Mar. 31, 2020

(65) Prior Publication Data
US 2020/0235222 A1    Jul. 23, 2020

Related U.S. Application Data

(63) Continuation of application No. 16/015,852, filed on Jun. 22, 2018, now abandoned.

(30) Foreign Application Priority Data

Dec. 21, 2017    (KR) .................. 10-2017-0177189

(51) Int. Cl.
*H01L 29/66*    (2006.01)
*H01L 29/78*    (2006.01)
(Continued)

(52) U.S. Cl.
CPC .... *H01L 29/6656* (2013.01); *H01L 21/31144* (2013.01); *H01L 29/42392* (2013.01);
(Continued)

(58) Field of Classification Search
CPC .......... H01L 29/66545; H01L 29/6656; H01L 29/42392
See application file for complete search history.

(56) References Cited

U.S. PATENT DOCUMENTS 8,309,414 B2 * 11/2012 Kawasaki ....... H01L 21/823468
                                                           438/241
8,835,244 B2   9/2014 Xie et al.
(Continued)

FOREIGN PATENT DOCUMENTS

KR    10-2016-0136042 A    11/2016
KR    10-2017-0066914 A    6/2017

OTHER PUBLICATIONS

Properties of SiO2 and Si3N4 at 300K, 2004, EESemi Comprehensive Reference on Semiconductor Manufacturing, accessible at https://eesemi.com/sio2si3n4.htm. (Year: 2004).*

*Primary Examiner* — Stephen M Bradley
(74) *Attorney, Agent, or Firm* — Sughrue Mion, PLLC

(57) ABSTRACT

Semiconductor devices and methods of fabricating the same are provided. The method includes forming on a substrate an active pattern that protrudes from the substrate and extends in one direction; forming on the active pattern a sacrificial gate structure that extends in a direction intersecting the active pattern; forming on a side surface of the sacrificial gate structure a first spacer including a first portion at a lower level than a top surface of the active pattern and a second portion on the first portion, and reducing a thickness of the second portion of the first spacer.

11 Claims, 20 Drawing Sheets

(51) Int. Cl.
*H01L 29/786* (2006.01)
*H01L 29/423* (2006.01)
*H01L 29/165* (2006.01)
*H01L 21/311* (2006.01)

(52) U.S. Cl.
CPC .... *H01L 29/6653* (2013.01); *H01L 29/66545* (2013.01); *H01L 29/66795* (2013.01); *H01L 29/7851* (2013.01); *H01L 29/78651* (2013.01); *H01L 29/78654* (2013.01); *H01L 29/78696* (2013.01); *H01L 29/165* (2013.01); *H01L 29/7848* (2013.01)

(56) References Cited

U.S. PATENT DOCUMENTS

| | | |
|---|---|---|
| 9,209,302 B2 * | 12/2015 | Tsai ............... H01L 21/31111 |
| 9,269,792 B2 | 2/2016 | Cheng et al. |
| 9,275,995 B2 | 3/2016 | Kim et al. |
| 9,287,403 B1 | 3/2016 | Lee et al. |
| 9,318,575 B2 | 4/2016 | Jeong et al. |
| 9,536,980 B1 | 1/2017 | Huang et al. |
| 9,685,532 B2 | 6/2017 | Basket et al. |
| 9,779,959 B2 | 10/2017 | Colinge et al. |
| 9,859,163 B2 | 1/2018 | Han et al. |
| 10,121,875 B1 | 11/2018 | Ho et al. |
| 2013/0154001 A1 | 6/2013 | Cai et al. |
| 2015/0372115 A1 * | 12/2015 | Koh ................ H01L 29/775 438/301 |
| 2016/0343709 A1 | 11/2016 | Kim et al. |
| 2017/0103916 A1 | 4/2017 | Jeon et al. |
| 2017/0162668 A1 | 6/2017 | Kim et al. |
| 2017/0352659 A1 * | 12/2017 | Basker ............ H01L 27/0886 |
| 2018/0122704 A1 | 5/2018 | Zhou |

* cited by examiner

SEMICONDUCTOR DEVICES HAVING A FIN-SHAPED ACTIVE REGION AND METHODS OF MANUFACTURING THE SAME

CROSS-REFERENCE TO RELATED APPLICATION

This application is a continuation of U.S. patent application Ser. No. 16/015,852, filed on Jun. 22, 2018, which claims the benefit of priority under 35 U.S.C. § 119 to Korean Patent Application No. 10-2017-0177189, filed on Dec. 21, 2017, in the Korean Intellectual Property Office, the entire contents of which are hereby incorporated by reference.

FIELD

The present disclosure relates generally to semiconductor devices and, more particularly, to three-dimensional semiconductor devices and methods of manufacturing the same.

BACKGROUND

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and integrated to meet these requested characteristics. As semiconductor devices become highly integrated, the scale down of transistors is also being accelerated and, thus, semiconductor devices may decrease in operating characteristics. As semiconductor devices become highly integrated, transistors have increasingly difficulty in achieving high performance to meet customer's requirements.

SUMMARY

Some embodiments of the present inventive concept provide methods of manufacturing a semiconductor device including forming on a substrate an active pattern that protrudes from the substrate and extends in one direction; forming on the active pattern a sacrificial gate structure that extends in a direction intersecting the active pattern; forming a first spacer on a side surface of the sacrificial gate structure, the first spacer including a first portion at a lower level than a top surface of the active pattern and a second portion on the first portion; and reducing a thickness of the second portion of the first spacer.

Further embodiments of the present inventive concept provide semiconductor devices including a substrate having an active region; and a transistor on the active region of the substrate. The transistor may comprise: a channel pattern extending in one direction on the substrate; a gate electrode crossing over the channel pattern; a dielectric layer between the channel pattern and the gate electrode; and a first spacer covering a side surface of the gate electrode. The first spacer may comprise a first portion at a lower level than a top surface of the channel pattern and a second portion on the first portion. A thickness of the second portion may be less than a thickness of the first portion.

Still further embodiments of the present inventive concept provide semiconductor devices including an active pattern protruding from a substrate and extending in one direction; a gate electrode running across the active pattern; a first spacer on a side surface of the gate electrode and disposed at a lower level than a top surface of the active pattern; and a second spacer on the side surface of the gate electrode and on the first spacer. A dielectric constant of the second spacer may be less than a dielectric constant of the first spacer.

BRIEF DESCRIPTION OF THE DRAWINGS

FIGS. 3A to 9A are cross-sections along the lines I-I' of FIGS. 1 and 10, respectively, illustrating processing steps in the fabrication of semiconductor devices according to some embodiments of the present inventive concept.

FIGS. 3B to 9B are cross-sections along the lines II-II' of FIGS. 1 and 10, respectively, illustrating processing steps in the fabrication of semiconductor devices according to some embodiments of the present inventive concept.

FIGS. 13A to 15A illustrate cross-sections showing a method of manufacturing a semiconductor device according to exemplary embodiments of inventive concept.

FIGS. 13B to 15B are cross-sections illustrating processing steps in the fabrication of semiconductor devices according to some embodiments of the present inventive concept

FIGS. 18A to 20A are cross-sections illustrating processing steps in the fabrication of semiconductor devices according to some embodiments of the present inventive concept.

FIGS. 18B to 20B are cross-sections illustrating processing steps in the fabrication of semiconductor devices according to some embodiments of the present inventive concept.

DETAILED DESCRIPTION OF EMBODIMENTS

Figure 1:
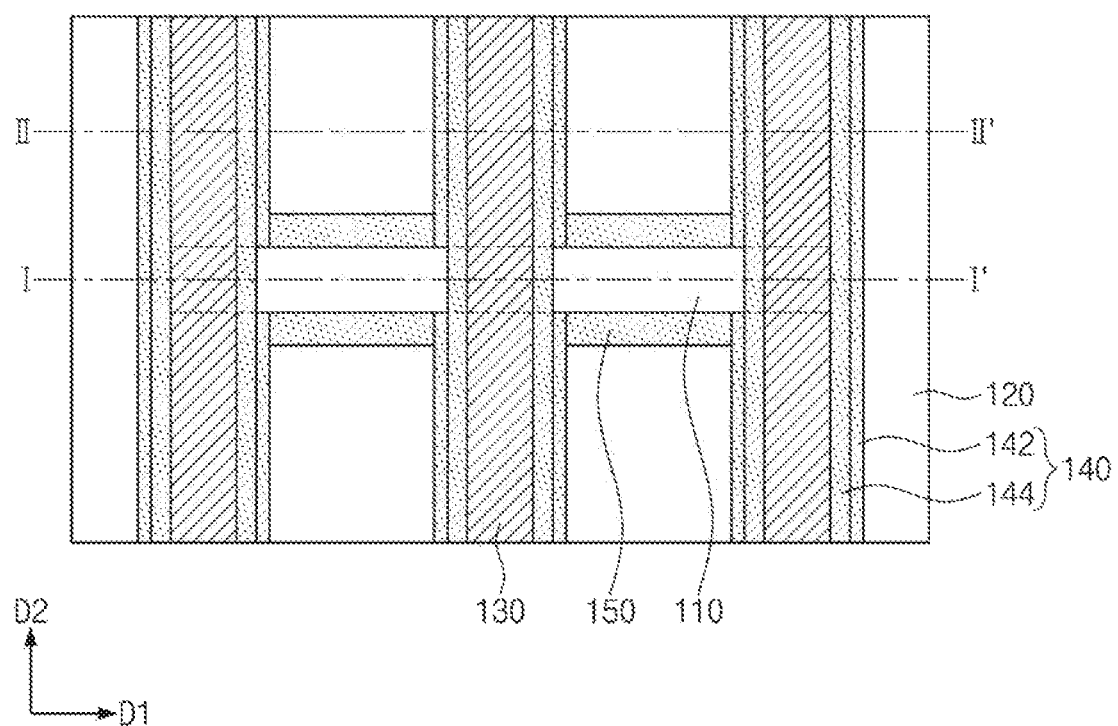
FIGS. 1 and 10 are plan views illustrating of semiconductor devices in accordance with some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation Furthermore to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, For example, of manufacturing techniques and/or tolerances, are to be expected. Thus, example embodiments should not be construed as limited to the particular shapes of regions illustrated herein but are to include deviations in shapes that result, For example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Processing steps in the fabrication of semiconductor devices according to inventive concept will now be discussed with reference to accompanying drawings. Like reference numerals may indicate like components throughout the description.

Figure 2:
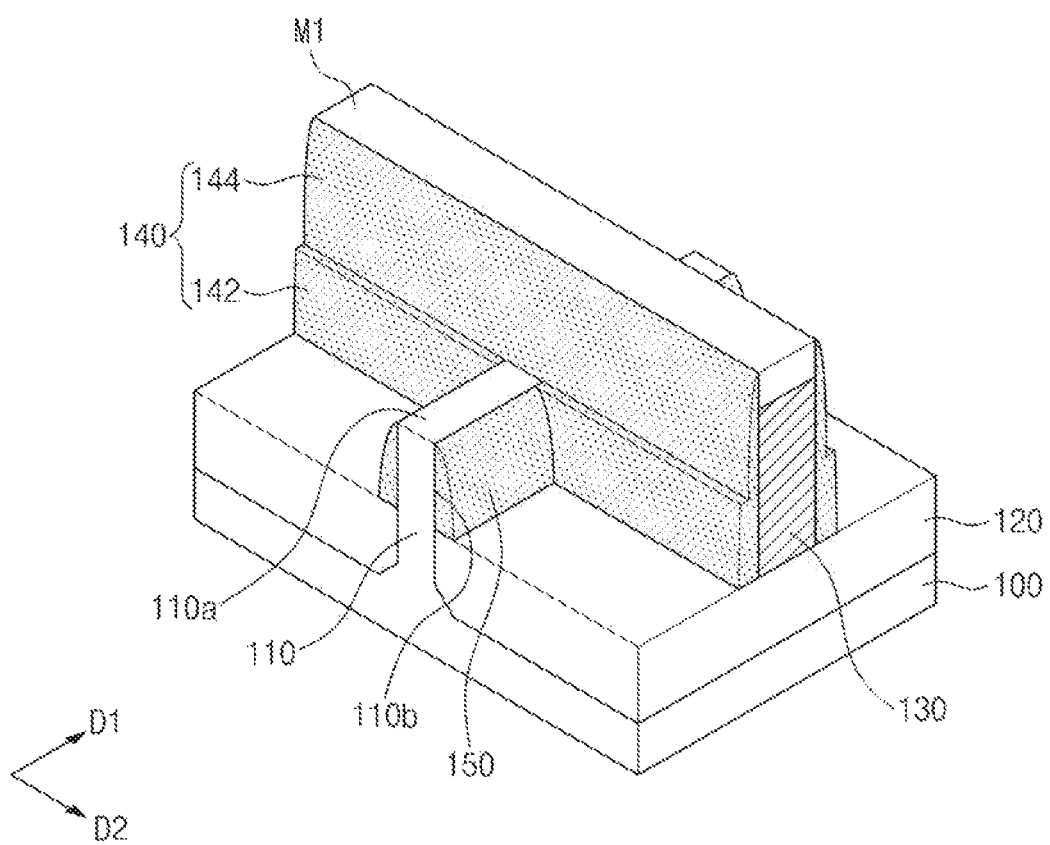
FIGS. 2 and 11 are perspective views according to some embodiments of the present inventive concept.
Figure 3A:
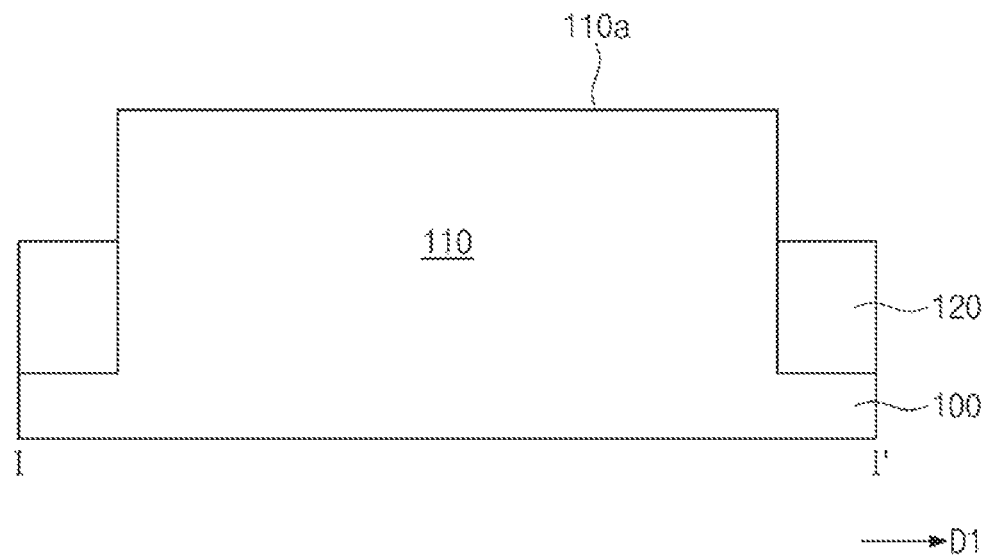
Figure 3B:
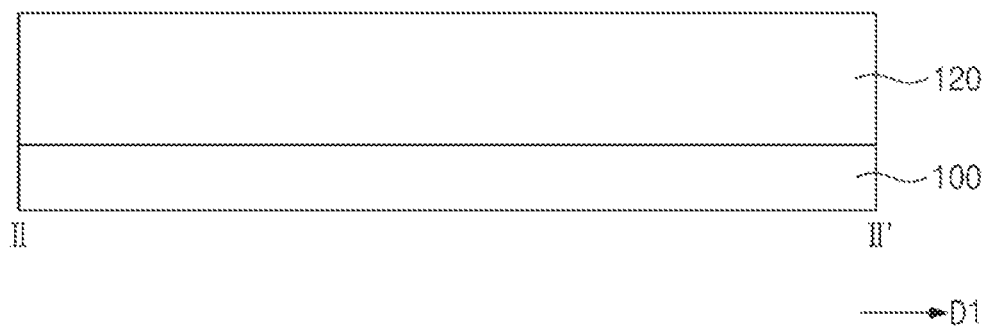
Figure 4A:
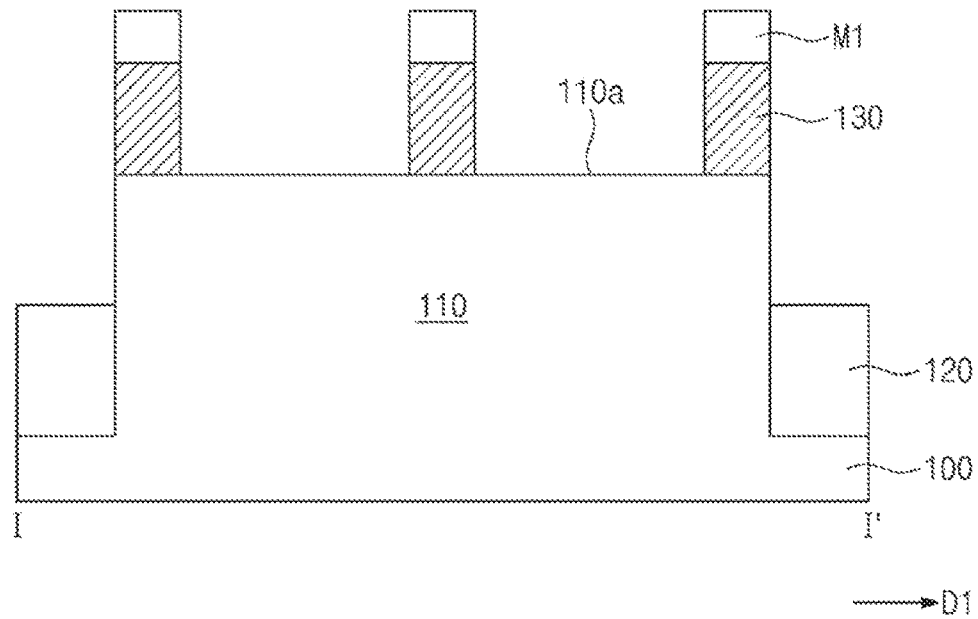
Figure 4B:
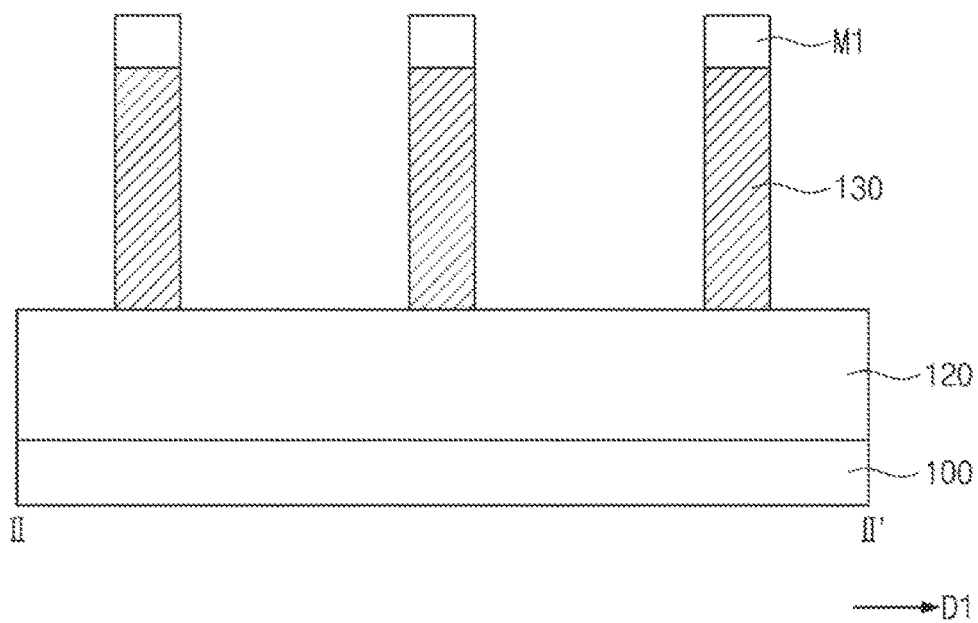
Figure 5A:
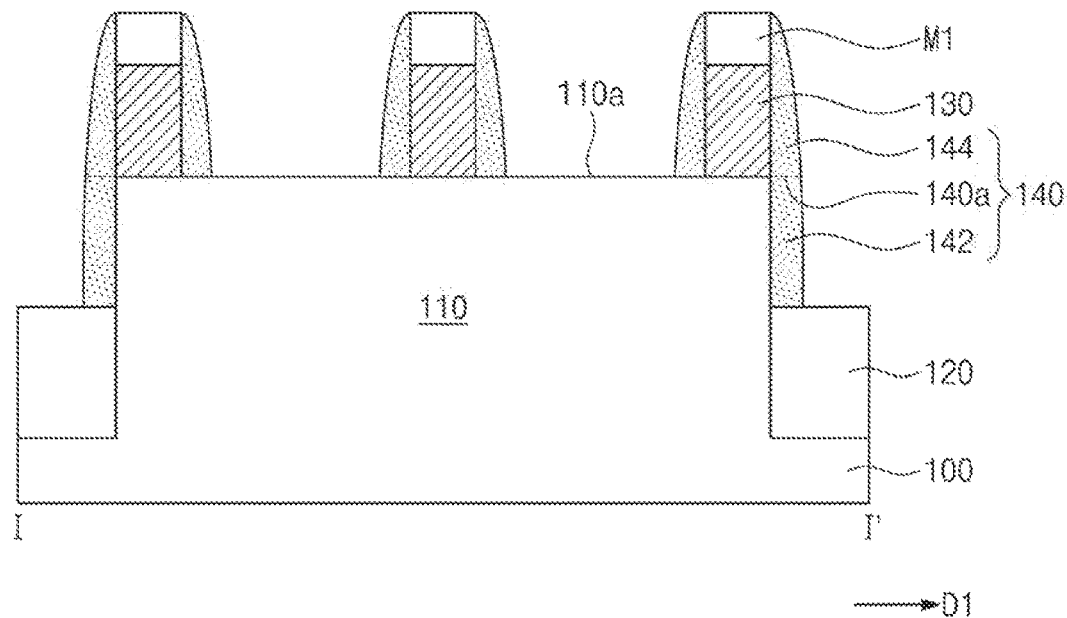
Figure 5B:
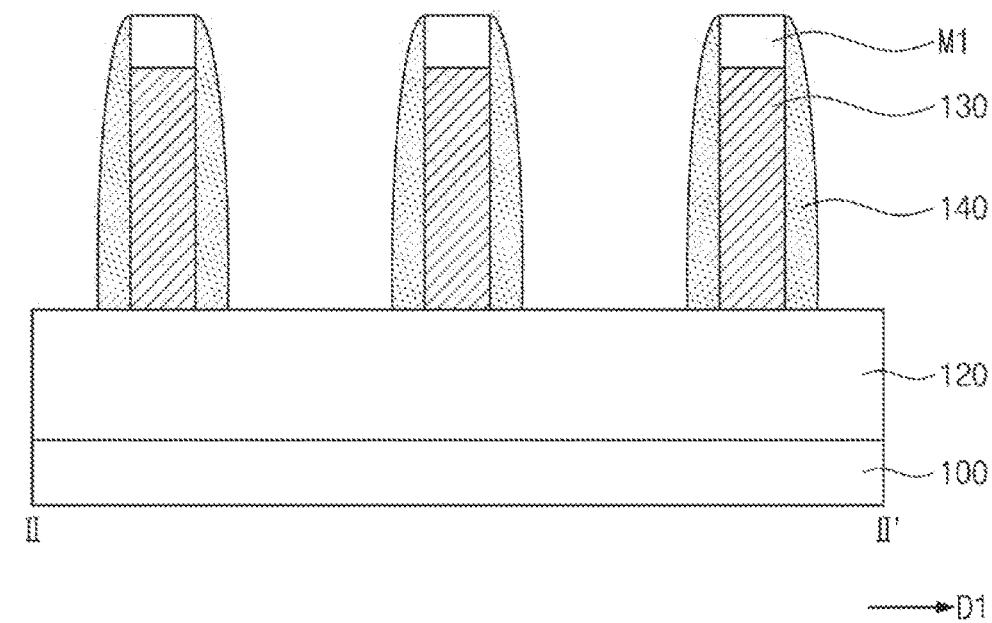
Figure 6A:
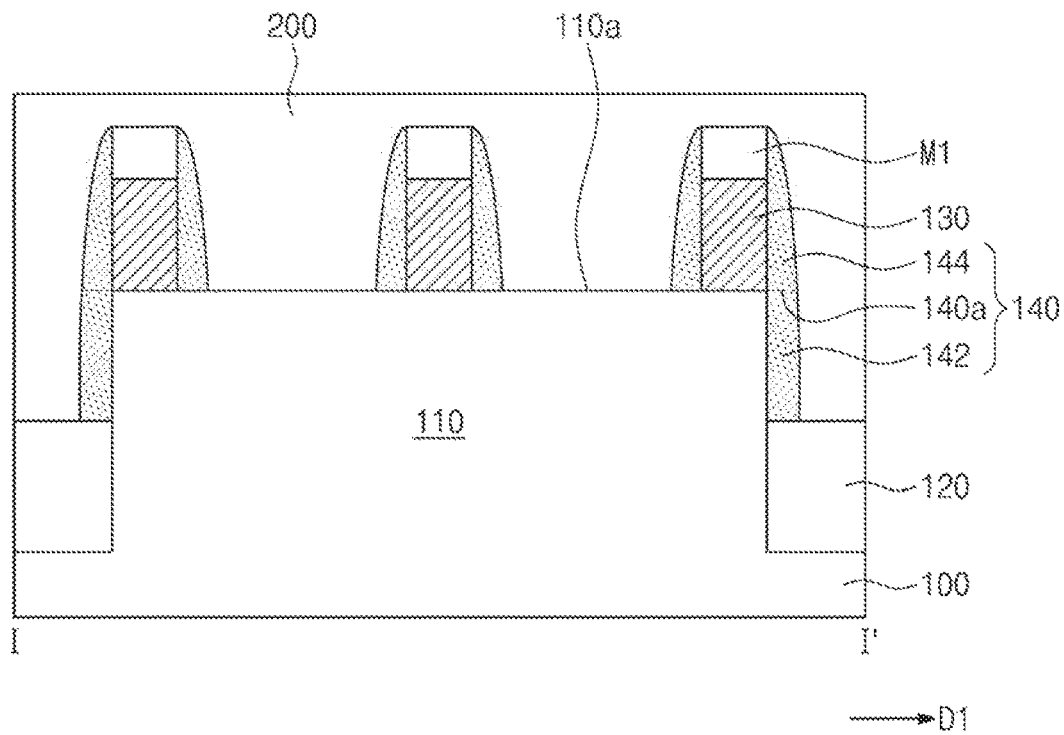
Figure 6B:
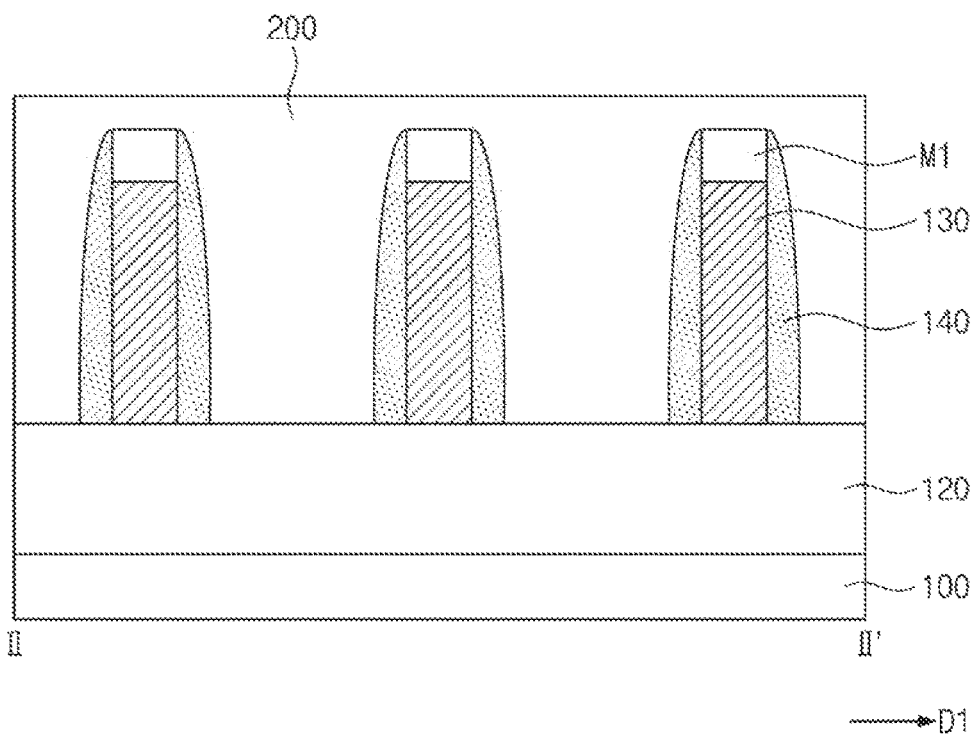
Figure 7A:
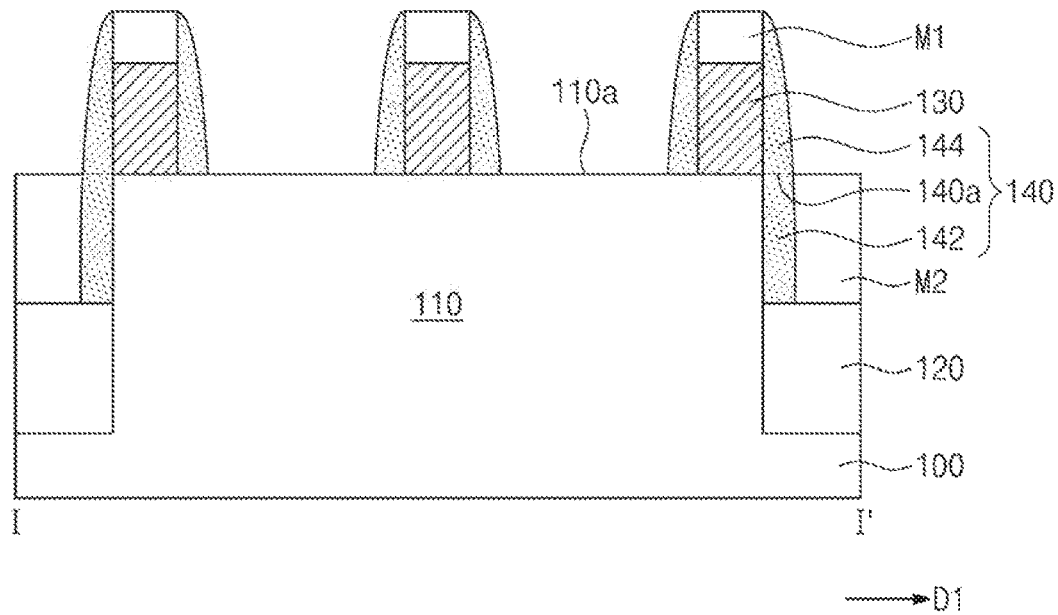
Figure 7B:
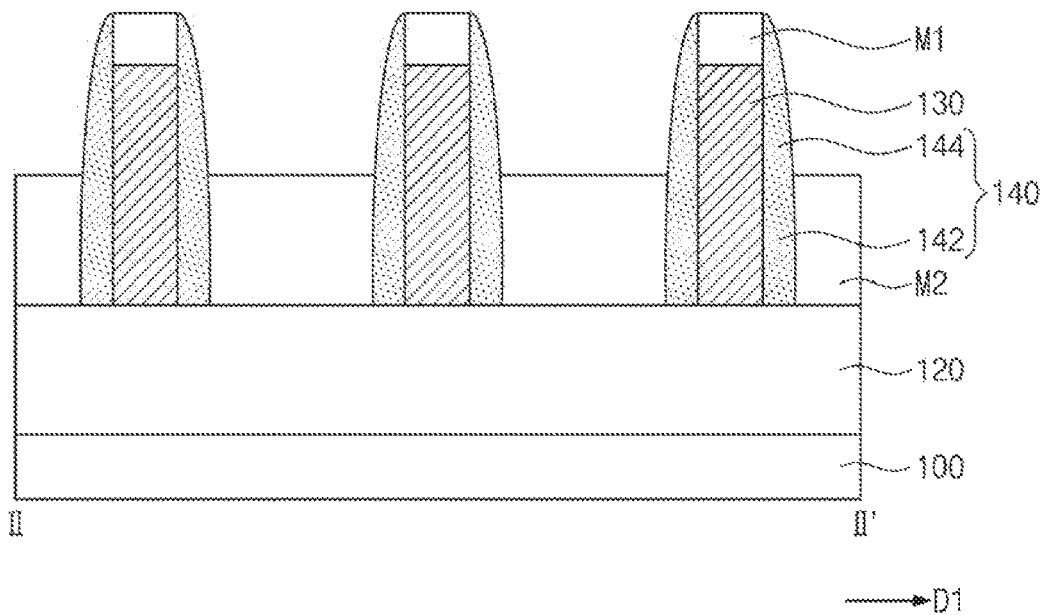
Figure 9A:
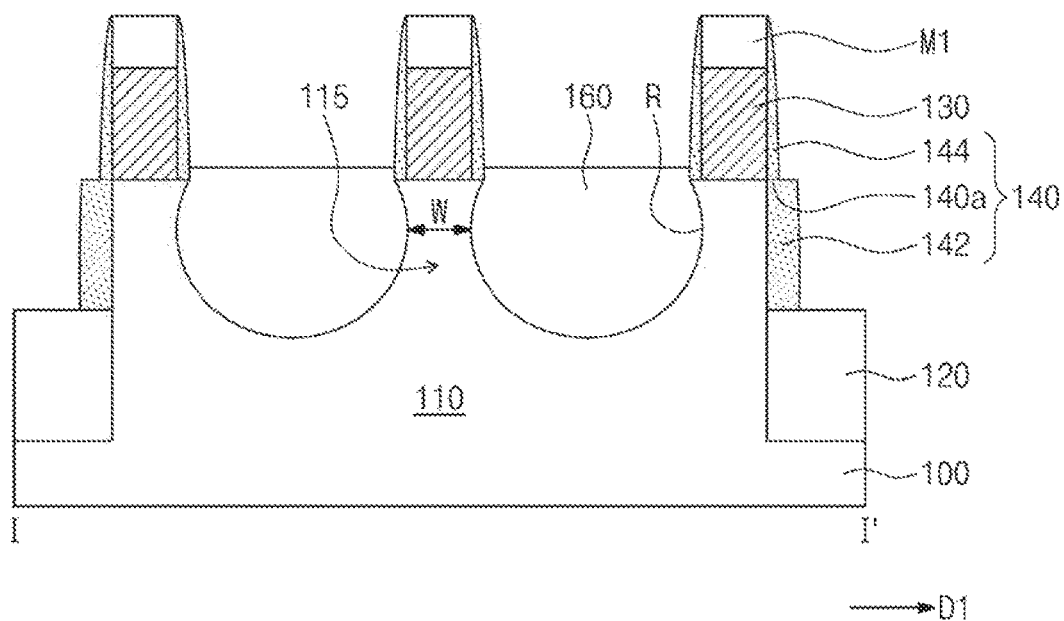
Figure 9B:
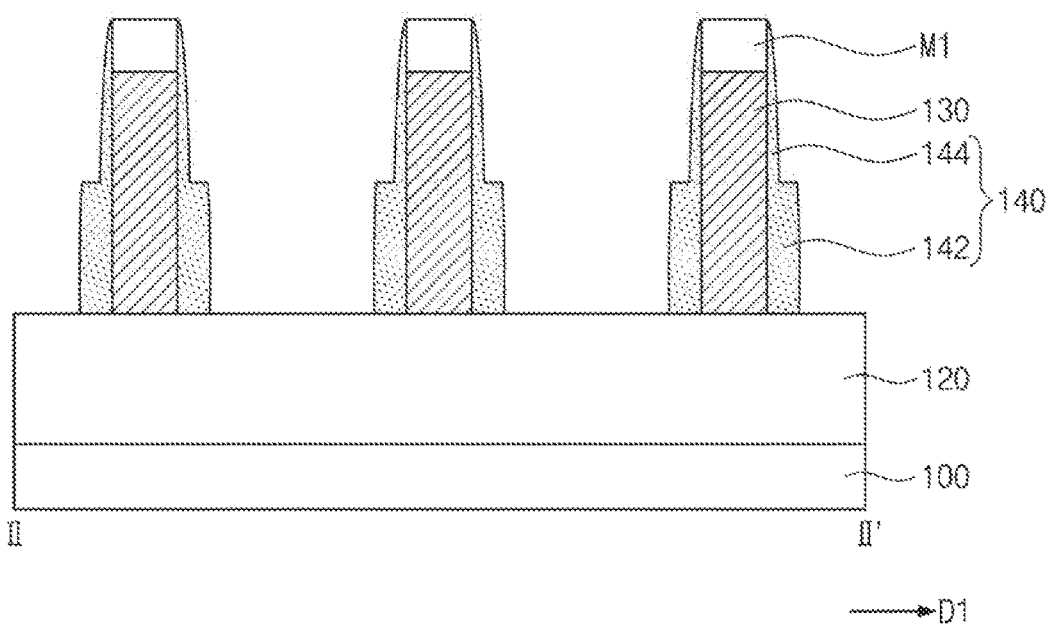
Figure 10:
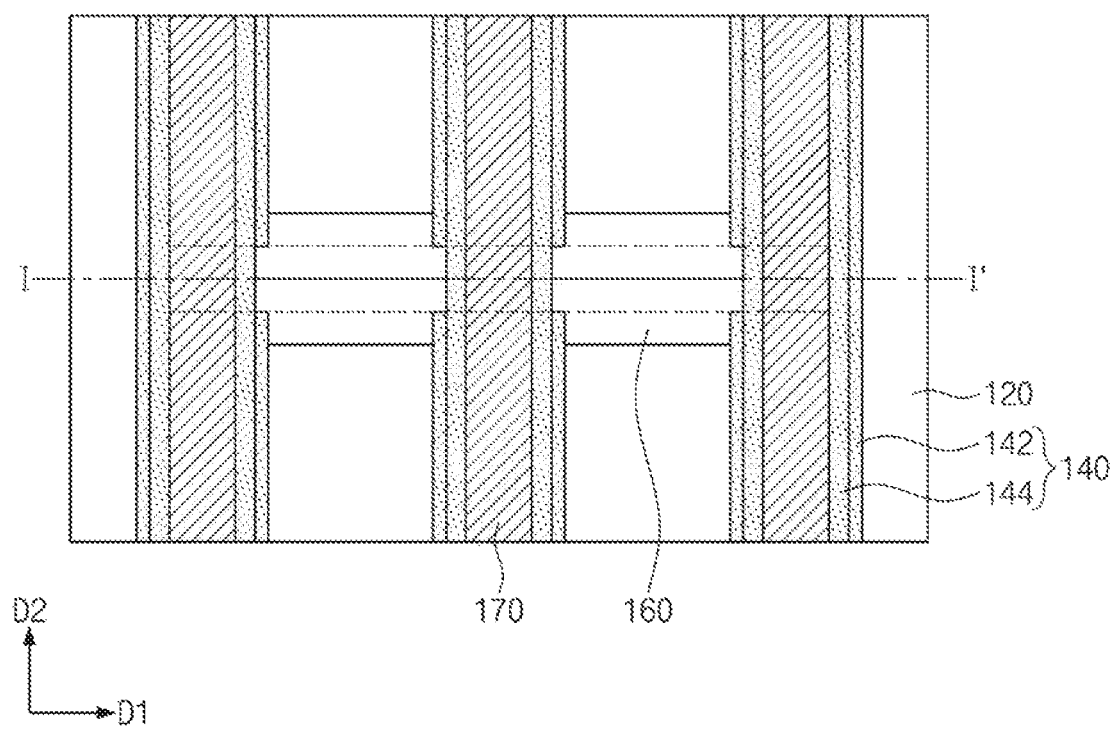
Figure 11:
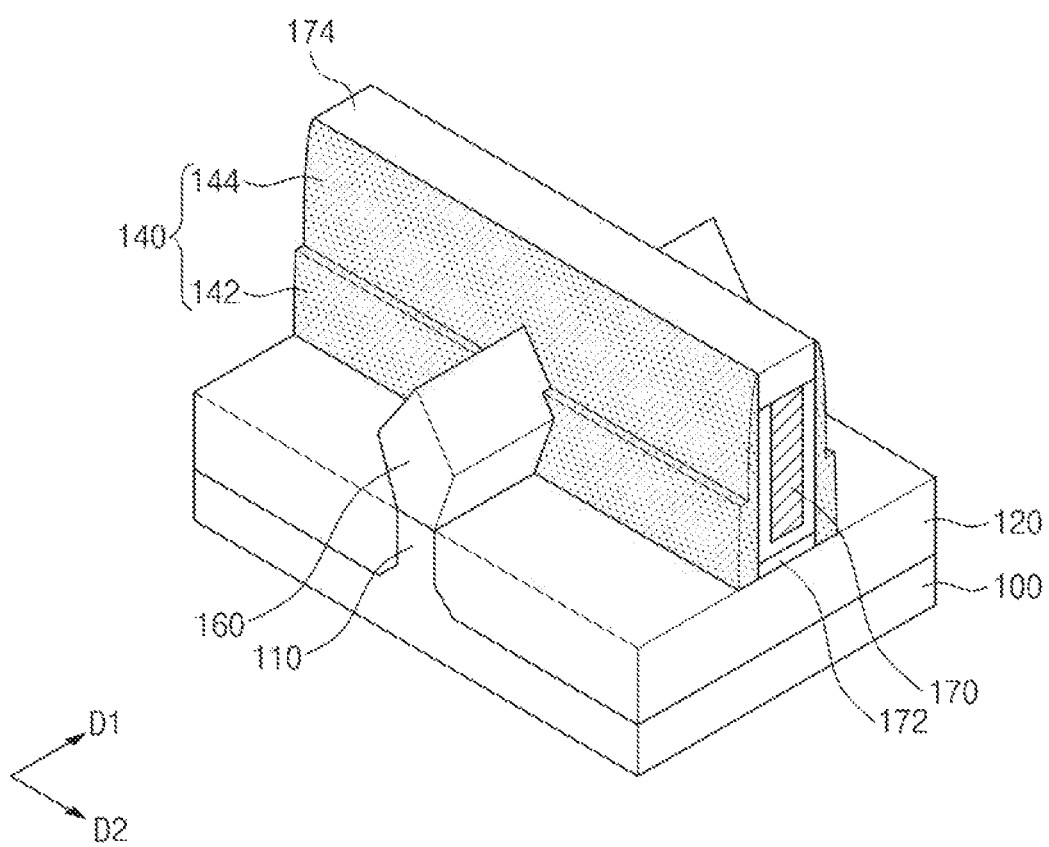
Figure 12:
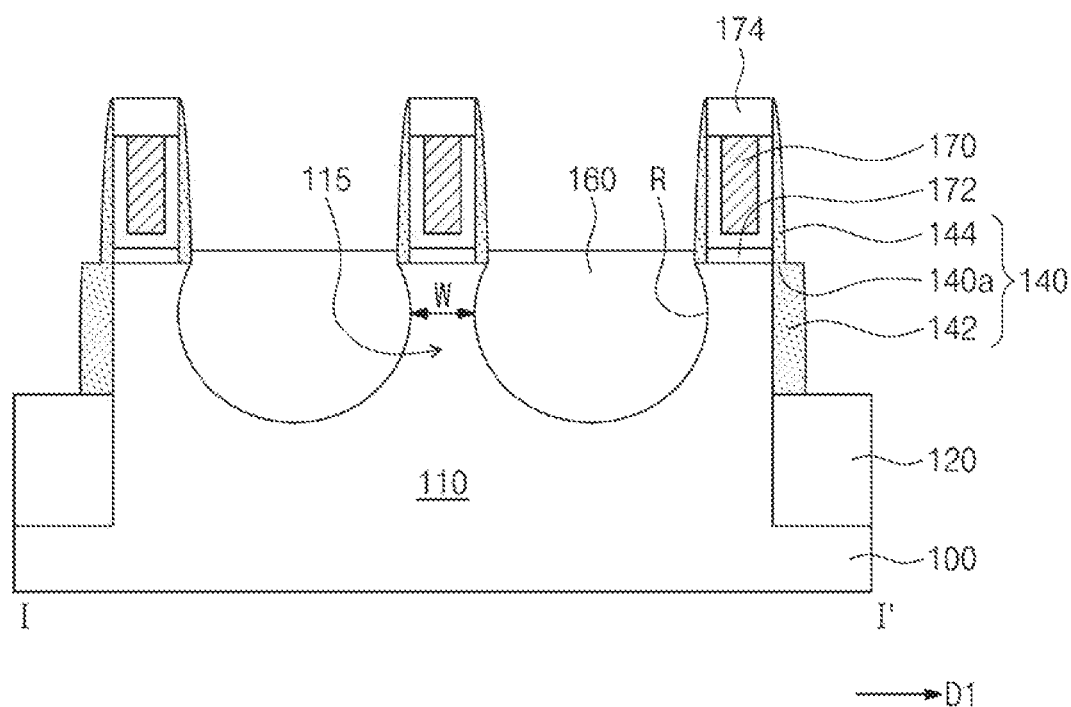
FIG. 12 illustrates a cross-section illustrating processing steps in the fabrication of semiconductor devices according to some embodiments of the present inventive concept.

FIGS. 1 and 10 illustrate plan views illustrating processing steps in the fabrication of semiconductor devices in accordance with some embodiments of the present inventive concept. FIGS. 2 and 11 illustrate perspective views showing portions of FIGS. 1 and 10, respectively. FIGS. 3A to 9A are cross-sections taken along line I-I' of FIG. 1 illustrating processing steps in the fabrication of semiconductor devices according to some embodiments of the present inventive concept. FIGS. 3B to 9B are cross-sections taken along line II-II' of FIG. 1 illustrating processing steps in the fabrication of semiconductor devices according to exemplary embodiments of inventive concept. FIG. 12 illustrates a cross-section taken along line I-I' of FIG. 10 illustrating processing steps in the fabrication of semiconductor devices according to exemplary embodiments of inventive concept.

Referring to FIGS. 1, 2, 3A, and 3B, a substrate 100 is provided. As illustrated, the substrate 100 may have an active region. The substrate 100 may be a semiconductor substrate. For example, the semiconductor substrate may be a bulk silicon substrate, a silicon-on-insulator (SOI) substrate, a germanium substrate, a germanium-on-insulator (GOI) substrate, a silicon-germanium substrate, or an epitaxial thin-layer substrate obtained by performing a selective epitaxial growth (SAG) process. The bulk silicon substrate may be doped with n-type or p-type impurities. In some embodiments, the semiconductor substrate may be III-V group compound semiconductor substrate. For example, III-V group compound semiconductor substrate may include one or more of gallium arsenide (GaAs), indium gallium arsenide (In GaAs), aluminum gallium arsenide (Algae's), and a mixture thereof.

An active pattern 110 may be formed on the substrate 100. The active pattern 110 may have a fin-shape. For example, the active pattern 110 may have a linear shape or bar shape extending in a first direction D1 on the substrate 100. The active pattern 110 may be a portion of the substrate 100, or may be formed by etching an epitaxial layer grown from the substrate 100. The active pattern 110 may include a semiconductor material, such as silicon (Si) or germanium (Ge). In some embodiments, the active pattern 110 may include a compound semiconductor, such as IV group compound semiconductor or III-V group compound semiconductor. For example, IV group compound semiconductor may be a binary or ternary compound including two or more of carbon (C), silicon (Si), germanium (Ge), and tin (Sn), or such binary or ternary compound doped with IV group element. For example, III-V group compound semiconductor may include one of binary, ternary, and quaternary compounds that is formed when one or more of III group elements, such as aluminum (Al), gallium (Ga), and indium (In), are combined with one of V group elements, such as phosphorous (P), arsenic (As) and antimony (Sb).

A device isolation layer 120 may be formed on the substrate 100. The formation of the device isolation layer 120 may include forming an insulation layer on an entire surface of the substrate 100 and recessing the insulation layer until the active pattern 110 is fully exposed. A top surface of the device isolation layer 120 may become lower than a top surface 110a of the active pattern 110.

Referring to FIGS. 1, 2, 4A, and 4B, a sacrificial gate structure 130 may be formed to run across the active pattern 110. The sacrificial gate structure 130 may be formed to have a linear or bar shape extending in a second direction D2. The formation of the sacrificial gate structure 130 may include forming a sacrificial layer on the substrate 100, forming a first mask pattern M1 on the sacrificial layer, and using the first mask pattern M1 as an etching mask to etch the sacrificial layer. The sacrificial layer may be formed using polysilicon. The first mask pattern M1 may be formed using a silicon oxide layer, a silicon nitride layer, or a silicon ox nitride layer.

Referring to FIGS. 1, 2, 5A, and 5B, a first spacer 140 may be formed on opposite sidewalls of the sacrificial gate structure 130. An insulation spacer 150 may be formed on opposite sidewalls 110b of the active pattern 110. The first spacer 140 and the insulation spacer 150 may be formed at the same time. The first spacer 140 and the insulation spacer 150 may include the same material as each other. For example, the first spacer 140 and the insulation spacer 150 may include one or more of silicon carbonitride (SiCN), silicon carbon oxynitride (SiCON), and silicon nitride (SiN). The formation of the first spacer 140 and the insulation spacer 150 may include performing a deposition process, such as chemical vapor deposition (CVD) or atomic layer deposition (ALD), to form a first spacer layer on the entire surface of the substrate 100, and performing an anisotropic etching process on the first spacer layer. The first spacer 140 may include an upper portion 144 at a higher level than the top surface 110a of the active pattern 110 and a lower portion 142 at a lower level than the top surface 110a of the active pattern 110. For example, the upper and lower portions 144 and 142 of the first spacer 140 may have therebetween a boundary 140a at substantially the same level as the top surface 110a of the active pattern 110. The lower portion 142 of the first spacer 140 may be provided on a sidewall of the active pattern 110, and the upper portion 144 of the first spacer 140 may be provided on the active pattern 110 and the lower portion 142 of the first spacer 140.

Referring to FIGS. 1, 2, 6A, and 6B, a buried layer 200 may be formed on the substrate 100. The buried layer 200 may cover the sacrificial gate structure 130, the active pattern 110, the first spacer 140, and the insulation spacer 150. The buried layer 200 may be a tonensilazene (TOSZ) oxide layer. The buried layer 200 may have an etch selectivity to the first spacer 140 and the insulation spacer 150.

Referring to FIGS. 1, 2, 7A, and 7B, an etching process may be performed on the buried layer 200. An upper portion of the buried layer 200 may be selectively removed, and the first spacer 140 and the insulation spacer 150 may be relatively less etched or may not be substantially etched during the etching process. The buried layer 200 may have a portion overlying the top surface 110a of the active pattern 110, and the portion of the buried layer 200 may be removed when the etching process is performed, which process may form a second mask pattern M2. The buried layer 200 may have other portion underlying the top surface 110a of the active pattern 110, and the other portion of the buried layer 200 may not be etched. The etching process may continue until a top surface of the second mask pattern M2 reaches a level substantially the same as the top surface 110a of the active pattern 110. For example, the top surface of the second mask pattern M2 may be substantially coplanar with the top surface 110a of the active pattern 110.

In some embodiments, the second mask pattern M2 may be formed to have a top surface lower than the top surface 110a of the active pattern 110. For example, the etching process may continue even after the top surface of the second mask pattern M2 reaches a level substantially the same as the top surface 110a of the active pattern 110. Some embodiments in which the top surface of the second mask pattern M2 is located at the same level as the top surface 110a of the active pattern 110 will be discussed.

Referring to FIGS. 1, 2, 8A, and 8B, the upper portion 144 of the first spacer 140 may be etched. For example, the lower portion 142 of the first spacer 140 may be buried in or covered with the second mask pattern M2, while the upper portion 144 of the first spacer 140 may be exposed. An anisotropic etching process may be performed on the exposed upper portion 144 of the first spacer 140. The upper portion 144 of the first spacer 140 may accordingly have a small thickness T2.

On the boundary 140a between the lower portion 142 and the upper portion 144, the lower portion 142 of the first spacer 140 may have a thickness T1 greater than the thickness T2 of the upper portion 144 of the first spacer 140. For example, the first spacer 140 may have a stepped shape between the lower portion 142 and the upper portion 144 on the boundary 140a.

Referring to FIGS. 1, 2, 9A, and 9B, the second mask pattern M2 may be removed. The lower portion 142 of the first spacer 140 may be exposed. The first mask pattern M1 and the first spacer 140 may be used as an etching mask to etch the active pattern 110, which etching may form a channel pattern 115. For example, the active pattern 110 may be etched to form recess regions R. The channel pattern 115 may be defined between a pair of neighboring recess regions R. The active pattern 110 may be over-etched during the etching process. For example, the active pattern 110 may be etched on its portion between the neighboring recess regions R and further be etched on its other portion beneath the sacrificial gate structure 130. The recess regions R may have sidewalls each protruding toward and below the sacrificial gate structure 130. The channel pattern 115 may thus be formed to have a small length W. Since the active pattern 110 is over-etched, the recess regions R may each have a bottommost end lower than the top surface of the device isolation layer 120.

According to some embodiments of the inventive concept, the upper portion 144 of the first spacer 140 may have the small thickness T2 covering the sidewall of the sacrificial gate structure 130. Though the active pattern 110 is generally required to be horizontally etched from a position below the upper portion 144 of the first spacer 140 toward a position below the sacrificial gate structure 130 in order to form the channel pattern 115 having the small length W, the small thickness T2 of the upper portion 144 may reduce the horizontal etching length of the active pattern 110 and the active pattern 110 may be easily etched below the sacrificial gate structure 130.

Thereafter, the insulation spacer 150 may be removed. In some embodiments, the insulation spacer 150 may be removed before the active pattern 110 is etched.

Source/drain patterns 160 may be formed to fill the recess regions R. The formation of the source/drain patterns 160 may include performing a selective epitaxial growth process on the active pattern 110. The source/drain patterns 160 may be formed of a semiconductor element, such as silicon germanium (SiGe). Simultaneously with or after the selective epitaxial growth process, the source/drain patterns 160 may be doped with p-type or n-type impurities. Since the sidewalls of the recess regions R protrude toward and below the sacrificial gate structures 130, the source/drain patterns 160 may also protrude toward and below the sacrificial gate structures 130.

Referring to FIGS. 10 to 12, a gate electrode 170 may be formed to fabricate a semiconductor device. The formation of the gate electrode 170 may include removing the first mask pattern M1, selectively removing the sacrificial gate structure 130, and forming a gate dielectric layer, a gate electrode, and a capping layer in an empty space where the sacrificial gate structure 130 is removed.

A semiconductor device may be provided with a substrate 100. The substrate 100 may have an active region. The substrate 100 may be a semiconductor substrate.

A device isolation layer 120 may be provided on the substrate 100. The device isolation layer 120 may define an active pattern 110 on an upper portion of the substrate 100. The active pattern 110 may have a fin-shape. For example, the active pattern 110 may have a linear or bar shape extending in a first direction D1 on the substrate 100.

The active pattern 110 may be provided thereon with a channel pattern 115 and source/drain patterns 160. The channel pattern 115 may be interposed between a pair of neighboring source/drain patterns 160. The channel pattern 115 may include one or more of silicon (Si), germanium (Ge), and silicon germanium (SiGe). The source/drain patterns 160 may be epitaxial patterns grown from the active pattern 110 serving as a seed layer. The source/drain patterns 160 may be p-type impurity regions. The source/drain patterns 160 may include a semiconductor element, such as silicon germanium (SiGe).

A gate electrode 170 may be disposed on the channel pattern 115. The gate electrode 170 may extend in a second direction D2 while crossing over the channel pattern 115. The gate electrode 170 may include metal or polysilicon.

A first spacer 140 may be disposed on opposite sidewalls of the gate electrode 170. The first spacer 140 may extend in the second direction D2 along the gate electrode 170. The first spacer 140 may include a lower portion 142 at a lower level than a top surface of the channel pattern 115 and an upper portion 144 at a higher level than the top surface of the channel pattern 115. For example, a boundary 140a between the upper and lower portions 144 and 142 of the first spacer 140 may be located at substantially the same level as a top surface 110a of the active pattern 110. On the boundary 140a between the lower portion 142 and the upper portion 144, the upper portion 144 of the first spacer 140 may have a thickness less than that of the lower portion 142 of the first spacer 140. The first spacer 140 may have a stepped shape between the lower portion 142 and the upper portion 144 on the boundary 140a. The lower portion 142 of the first spacer 140 may be placed between the gate electrode 170 and the source/drain patterns 160. The first spacer 140 may include one or more of silicon carbonitride (SiCN), silicon carbon oxynitride (SiCON), and silicon nitride (SiN).

A gate dielectric layer 172 may be between the gate electrode 170 and the channel pattern 115. The gate dielectric layer 172 may cover the channel pattern 115. The gate dielectric layer 172 may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern 174 may be provided on the gate electrode 170. The gate capping pattern 174 may extend in the second direction D2 along the gate electrode 170. The gate capping pattern 174 may include one or more of silicon oxide ($SiO_2$), silicon carbonitride (SiCN), silicon carbon oxynitride (SiCON), and silicon nitride (SiN).

According to some embodiments of the inventive concept, since the first spacer 140 includes the upper portion 144 having a small thickness on the channel pattern 115, it may be easy to form the source/drain patterns 160 protruding toward and below the gate electrode 170 and to also form the channel pattern 115 having the small length W. The channel pattern 115 may then decrease in resistance. In addition, since the first spacer 140 includes the lower portion 142 having a great thickness, it may be possible to reduce a parasitic capacitance between the gate electrodes 170 adjacent to a side of the channel pattern 115 and between the gate electrode 170 and the source/drain patterns 160. A semiconductor device according to inventive concept may consequently increase in electrical characteristics.

FIGS. 13A to 15A are cross-sections taken along line I-I' of FIG. 1 illustrating processing steps in the fabrication of semiconductor devices according to some embodiments of the present inventive concept. FIGS. 13B to 15B are cross-sections taken along line II-II' of FIG. 1 illustrating processing steps in the fabrication of semiconductor devices according to some embodiments of the present inventive concept.

Figure 8A:
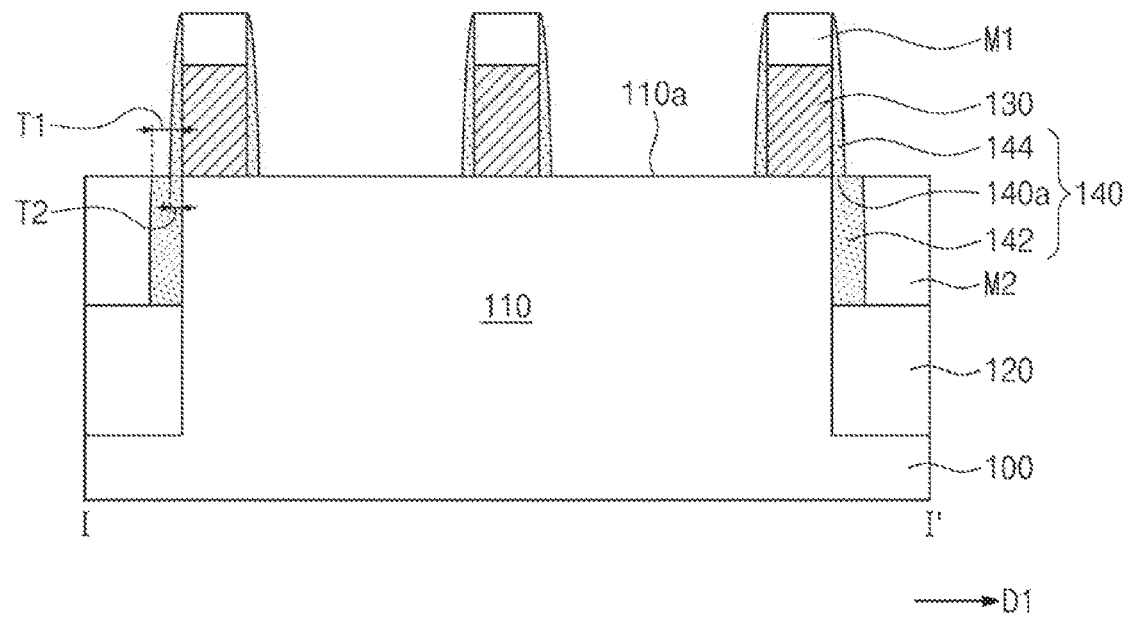
Figure 8B:
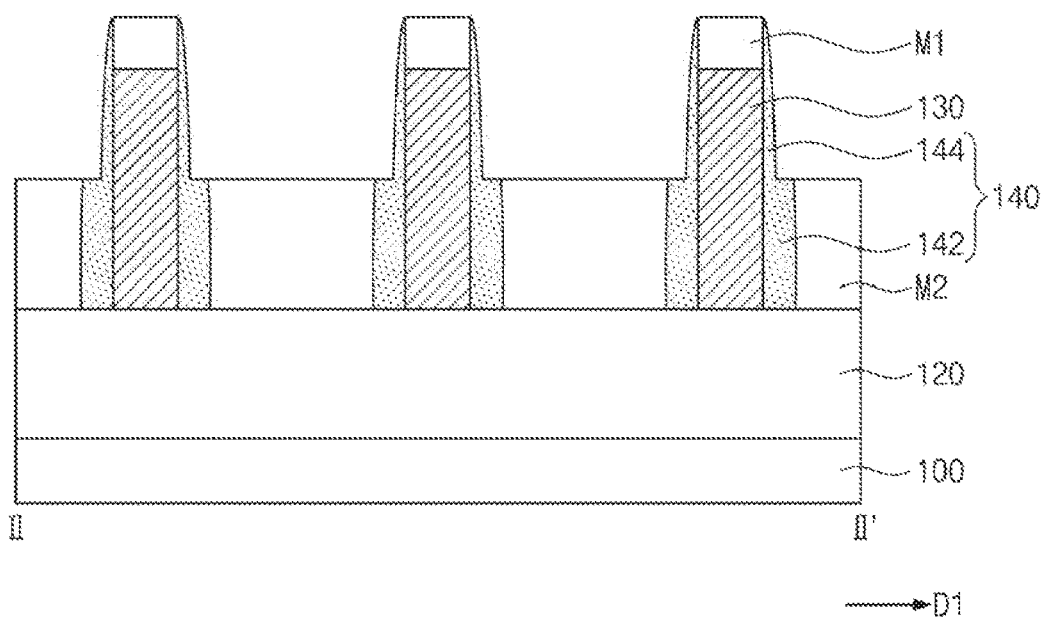
Figure 13A:
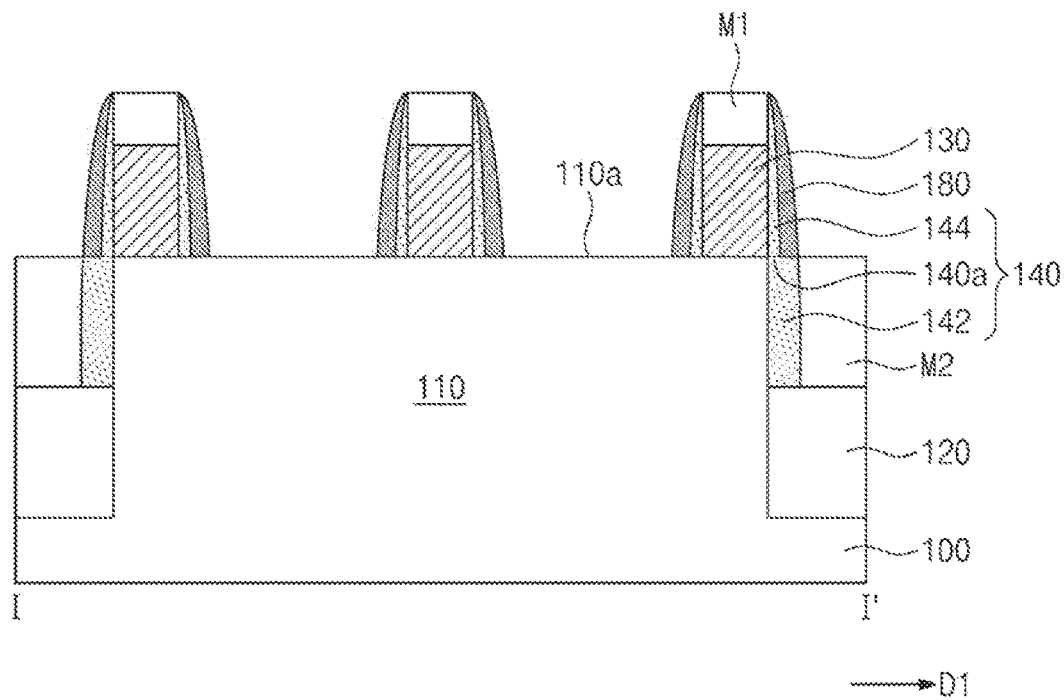
Figure 13B:
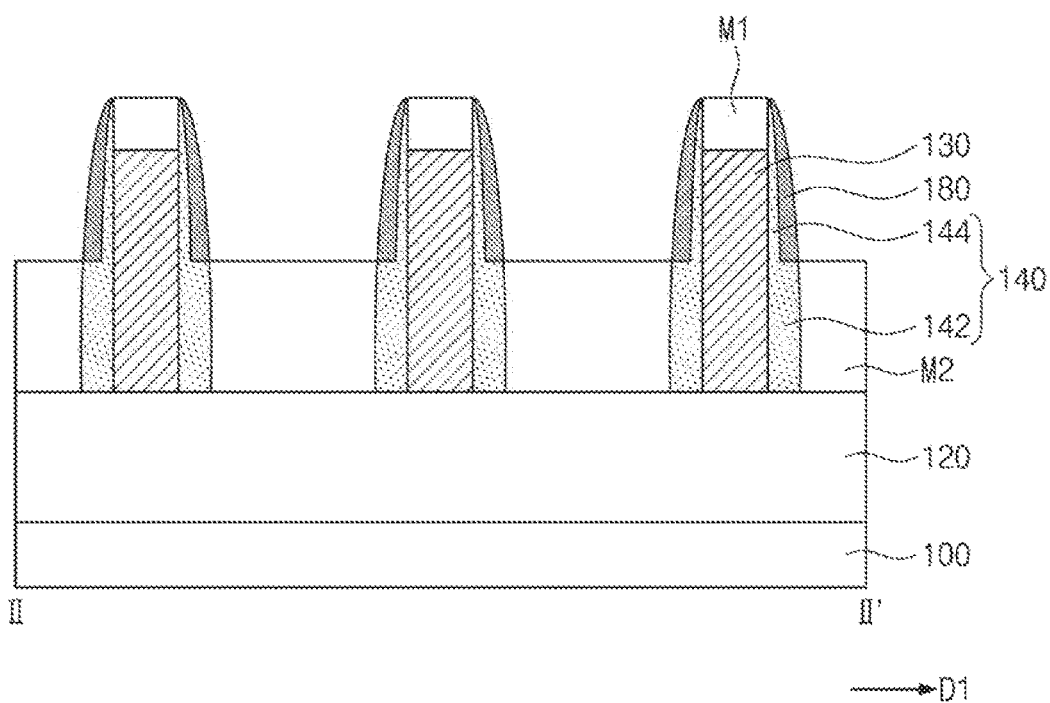

Referring to FIGS. 13A and 13B, a second spacer 180 may be formed on a resultant structure of FIGS. 8A and 8B. For example, the second spacer 180 may be formed on a top surface of the first mask pattern M1 and exposed sidewalls of the upper portion 144 of the first spacer 140. The upper portion 144 of the first spacer 140 may have a shape extending from the lower portion 142 toward between the second spacer 180 and the sacrificial gate structure 130. The formation of the second spacer 180 may include performing a deposition process, such as chemical vapor deposition (CVD) or atomic layer deposition (ALD), to form a second spacer layer on the entire surface of the substrate 100, and performing an anisotropic etching process on the second spacer layer. The second spacer 180 may have a dielectric constant less than that of the first spacer 140. For example, when the first spacer 140 includes SiN, the second spacer 180 may include silicon carbon oxynitride (SiCON) or silicon oxide ($SiO_2$).

Figure 14A:
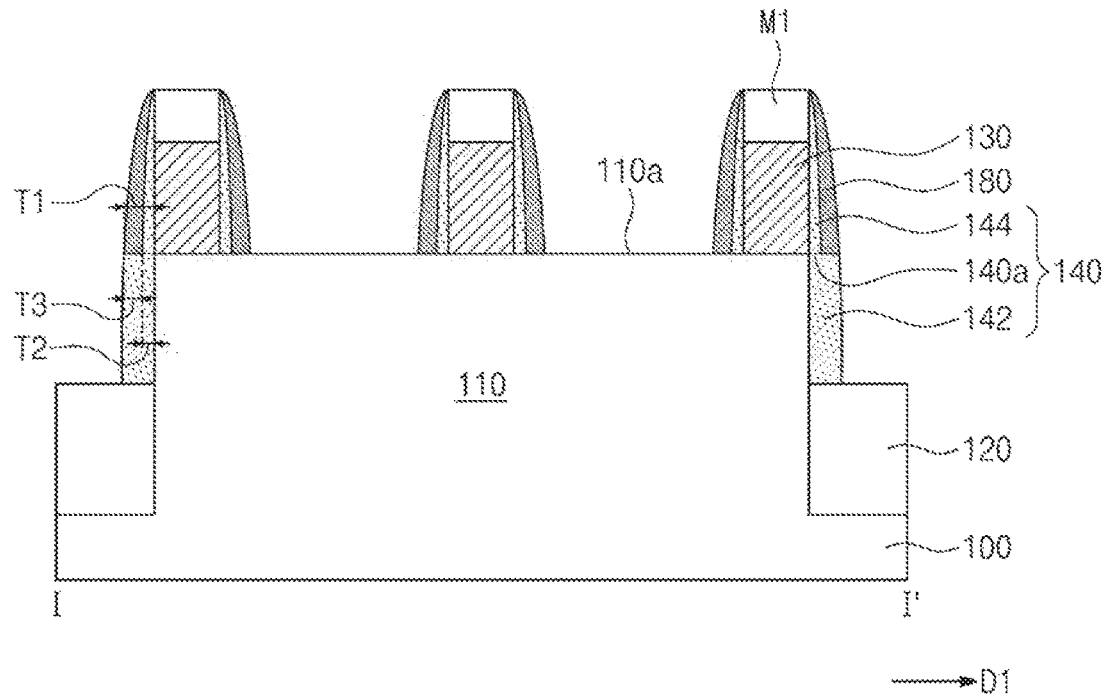
Figure 14B:
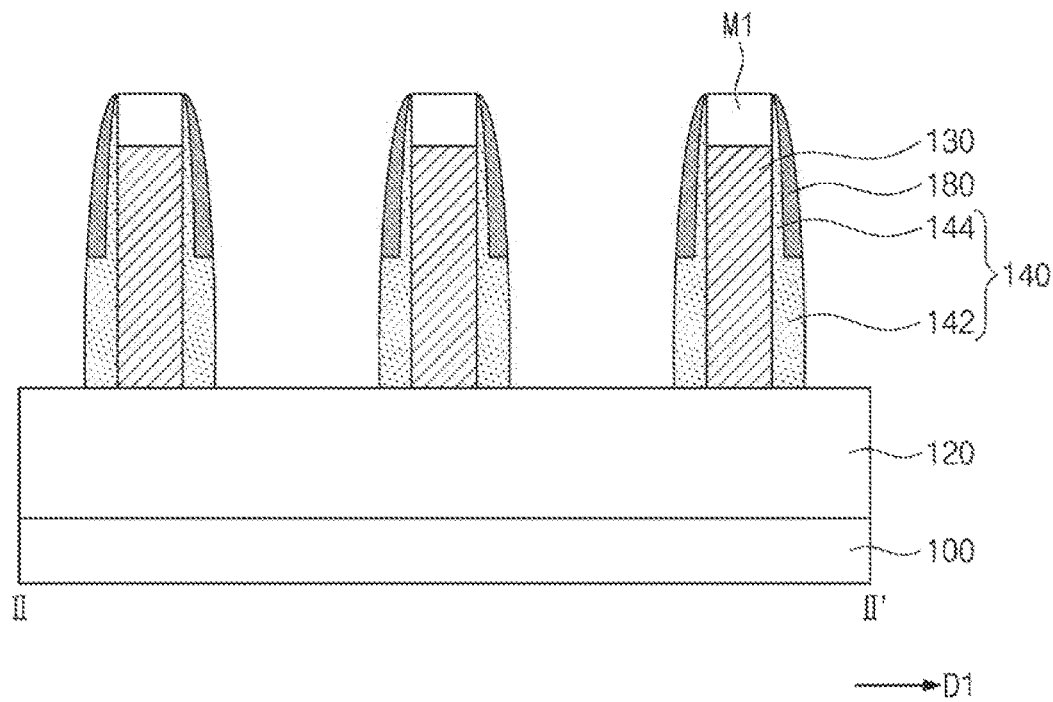

Referring to FIGS. 14A and 14B, the second mask pattern M2 may be removed. The lower portion 142 of the first spacer 140 may be exposed. On the boundary 140a between the lower portion 142 and the upper portion 144, a sum of the thickness T2 of the upper portion 144 of the first spacer 140 and a thickness T3 of the second spacer 180 may be the same as the thickness T1 of the lower portion 142 of the first spacer 140. For example, a side surface of the lower portion 142 of the first spacer 140 may be coplanar with a side surface of the second spacer 180. In some embodiments, on the boundary 140a between the lower portion 142 and the upper portion 144, the sum of the thickness T2 the upper portion 144 of the first spacer 140 and the thickness T3 of the second spacer 180 may be less than the thickness T1 of the lower portion 142 of the first spacer 140.

Figure 15A:
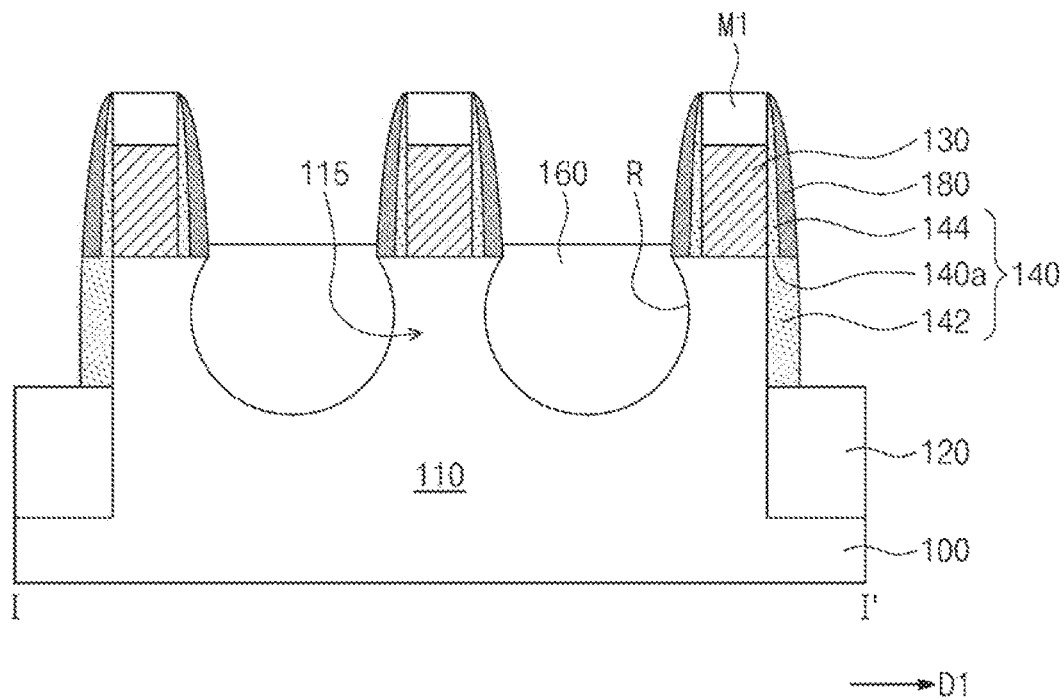
Figure 15B:
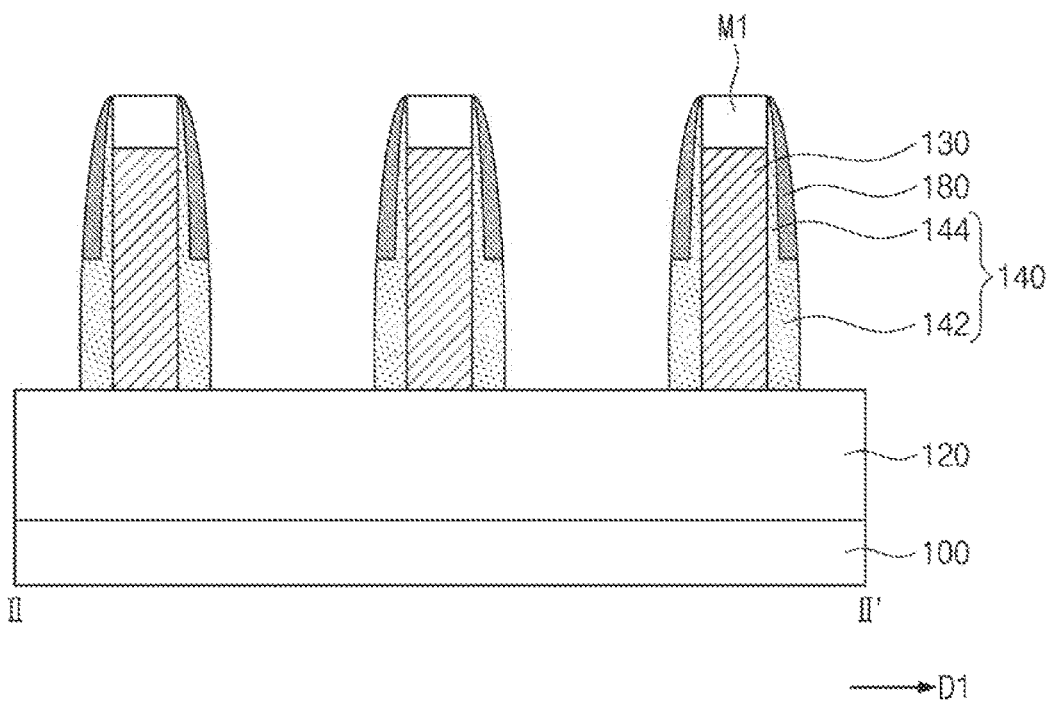

Referring to FIGS. 15A and 15B, the first mask pattern M1, the first spacer 140, and the second spacer 180 may be used as an etching mask to etch the active pattern 110, which etching may form a channel pattern 115. The channel pattern 115 may be defined between a pair of neighboring recess regions R.

Source/drain patterns 160 may be formed to fill the recess regions R. The formation of the source/drain patterns 160 may include performing a selective epitaxial growth process on the active pattern 110. Simultaneously with or after the selective epitaxial growth process, the source/drain patterns 160 may be doped with p-type or n-type impurities. Thereafter, a gate electrode 170 may be formed as discussed with reference to FIGS. 10 to 12 above.

Figure 16A:
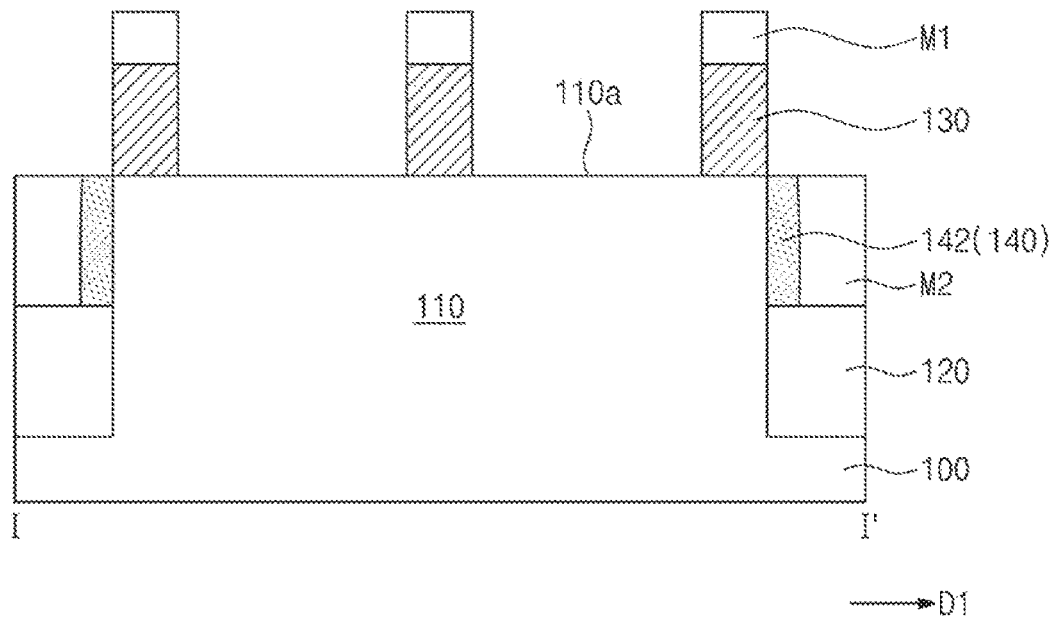
FIGS. 16A and 17A are cross-sections illustrating processing steps in the fabrication of semiconductor devices according to some embodiments of the present inventive concept.
Figure 16B:
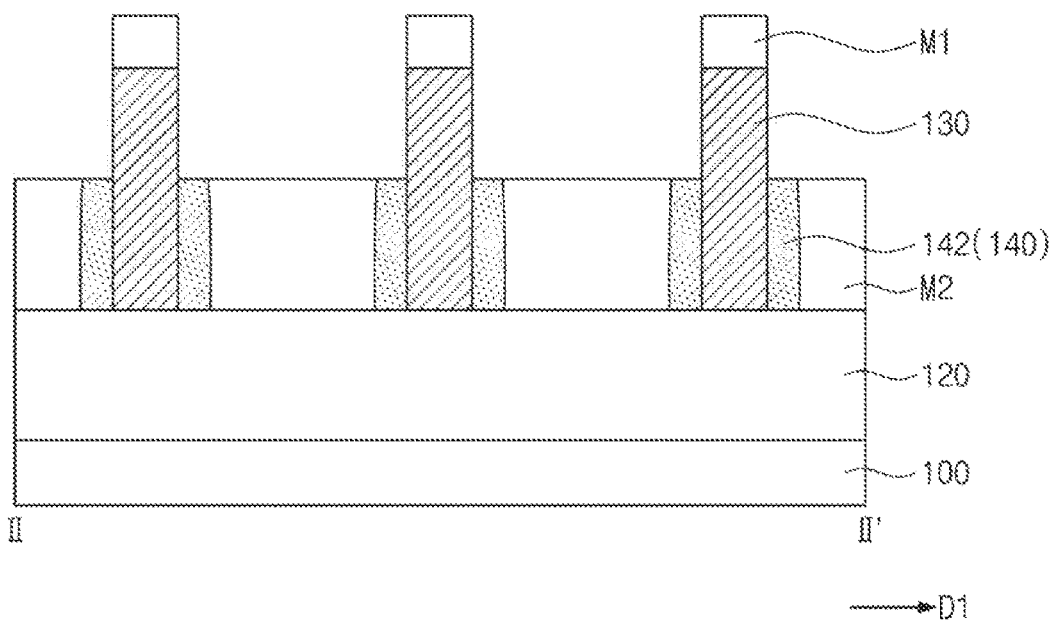
FIGS. 16B and 17B are cross-sections illustrating processing steps in the fabrication of semiconductor devices according to some embodiments of the present inventive concept.
Figure 17A:
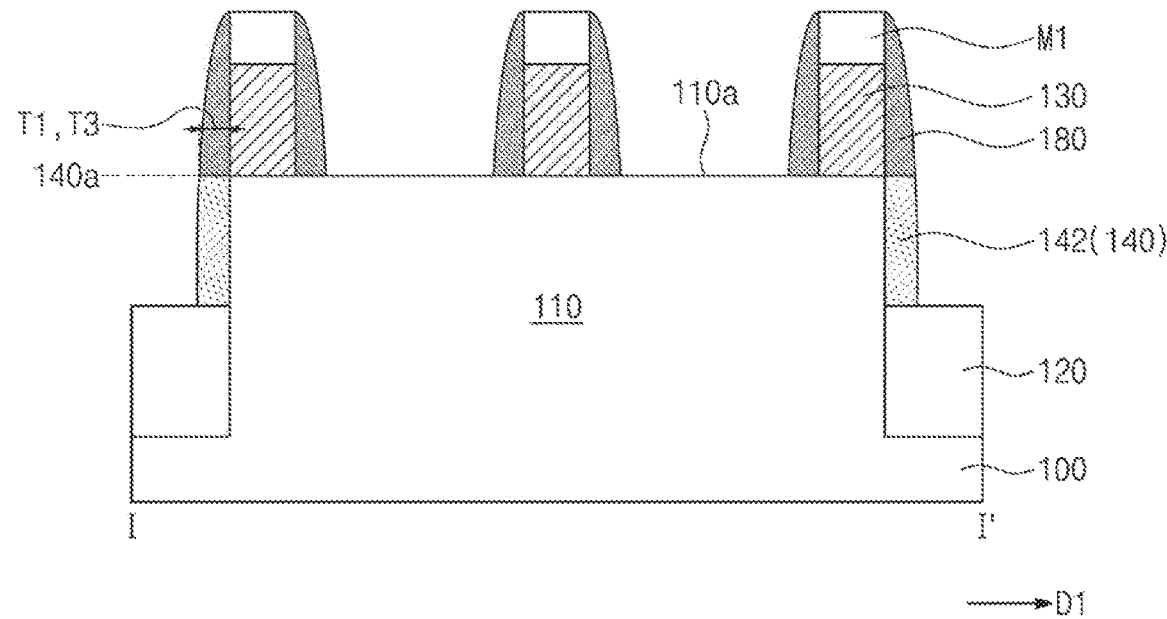
Figure 17B:
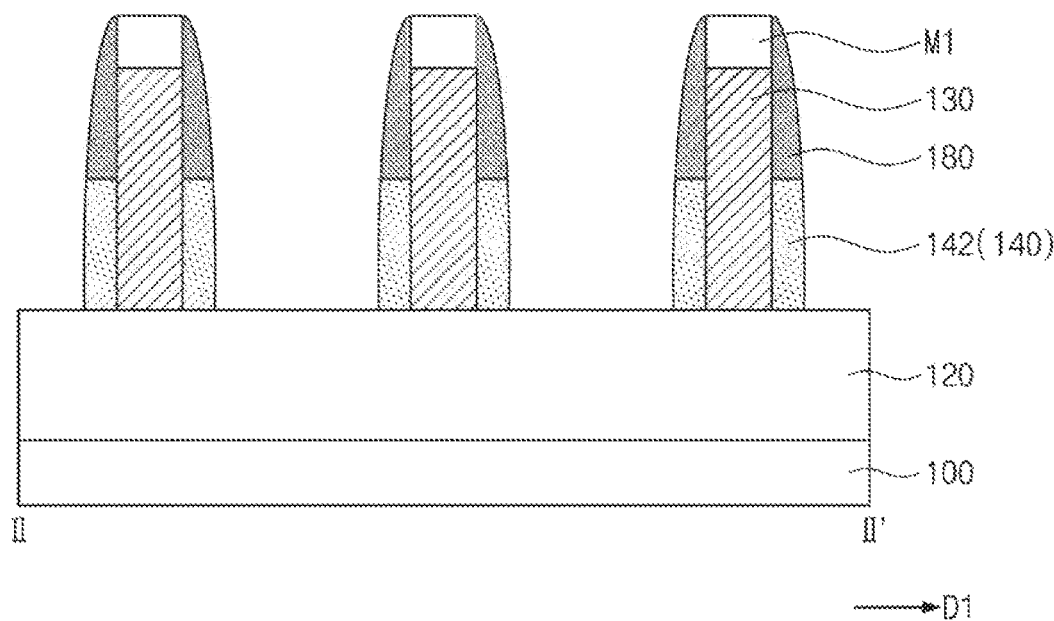

FIGS. 16A and 17A are cross-sections taken along line I-I' of FIG. 1 illustrating processing steps in the fabrication of semiconductor devices according to some embodiments of the present inventive concept. FIGS. 16B and 17B are cross-sections taken along line II-II' of FIG. 1 illustrating processing steps in the fabrication of semiconductor devices according to some embodiments of the present inventive concept.

Referring to FIGS. 16A and 16B, an etching process may be performed on a resultant structure of FIGS. 8A and 8B. The etching process may completely remove the upper portion 144 of the first spacer 140. The sacrificial gate structure 130 may be partially exposed when the etching process is performed.

Referring to FIGS. 17A and 17B, a second spacer 180 may be formed. For example, the second spacer 180 may be formed on a top surface of the first mask pattern M1 and exposed sidewalls of the sacrificial gate structure 130. The formation of the second spacer 180 may include performing a deposition process, such as chemical vapor deposition (CVD) or atomic layer deposition (ALD), to form a second spacer layer on the entire surface of the substrate 100, and performing an anisotropic etching process on the second spacer layer. The second spacer 180 may have a dielectric constant less than that of the first spacer 140. On the boundary 140a between the lower portion 142 and the upper portion 144, a thickness T3 of the second spacer 180 may be the same as the thickness T1 of the lower portion 142 of the first spacer 140. For example, a side surface of the lower portion 142 of the first spacer 140 may be coplanar with a side surface of the second spacer 180. Alternatively, the thickness T3 of the second spacer 180 may be less than the thickness T1 of the lower portion 142 of the first spacer 140. After that, a similar process as that discussed with reference to FIGS. 15A and 15B may be performed.

According to some embodiments of inventive concept, the channel pattern 115 may be provided thereon with the second spacer 180 having a low dielectric constant. In such a configuration, the gate electrode 170 may be provided on its upper portion with the second spacer 180 having a low dielectric constant, and therefore, it may be possible to reduce a leakage current from the upper portion of the gate electrode 170. Furthermore, since the upper portion of the gate electrode 170 and the source/drain pattern 160 are provided therebetween with the second spacer 180 having a low dielectric constant, it may be possible to reduce a parasitic capacitance between the upper portion of the gate electrode 170 and the source/drain pattern 160.

FIGS. 18A to 20A are cross-sections taken along line I-I' of FIG. 1 illustrating processing steps in the fabrication of semiconductor devices according to some embodiments of the present inventive concept. FIGS. 18B to 20B are cross-sections taken along line II-II' of FIG. 1 illustrating processing steps in the fabrication of semiconductor devices according to some embodiments of the present inventive concept.

Figure 18A:
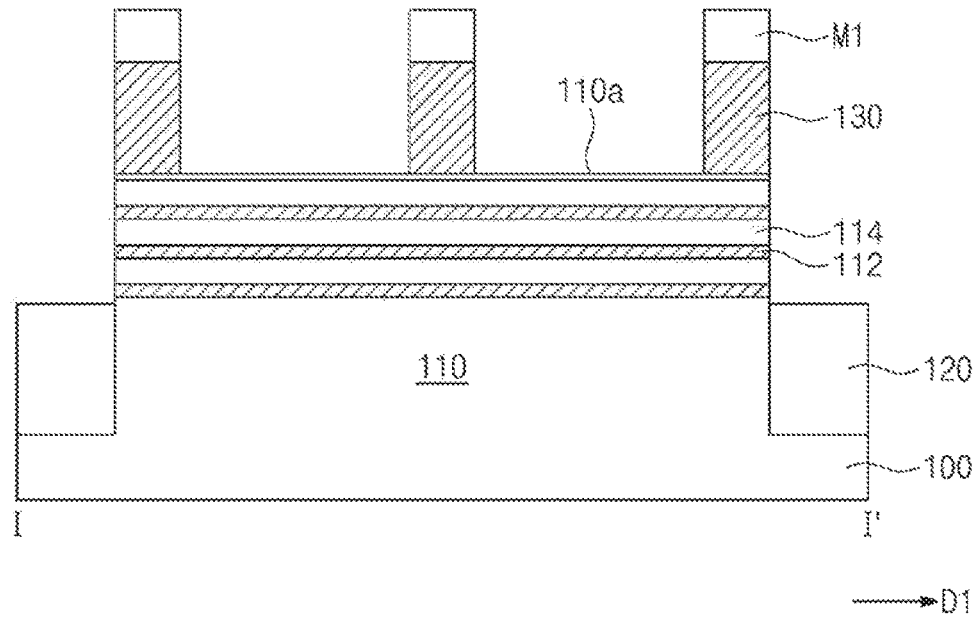
Figure 18B:
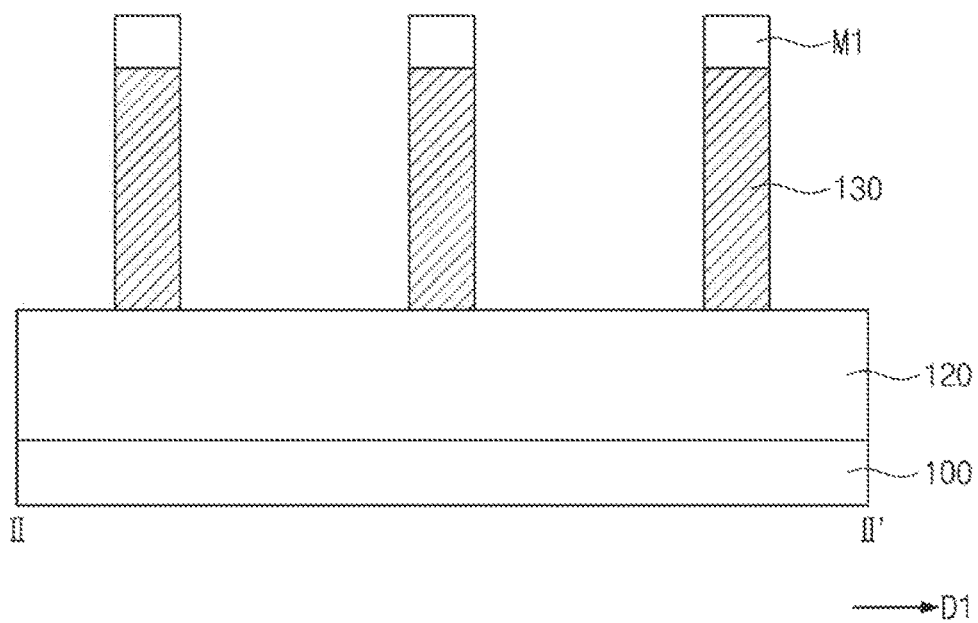

Referring to FIGS. 18A and 18B, a substrate 100 may be provided. The substrate 100 may have an active region. The substrate 100 may be a semiconductor substrate.

An active pattern 110 may be formed on the substrate 100. For example, sacrificial layers 112 and semiconductor layers 114 may be alternately and repeatedly stacked on an entire surface of the substrate 100. The sacrificial layers 112 may include a material having an etch selectivity to the semiconductor layers 114. For example, the sacrificial layers 112 may include silicon germanium (SiGe) or germanium (Ge), and the semiconductor layers 114 may include silicon (Si). The sacrificial layers 112 and the semiconductor layers 114 may be formed by an epitaxial growth process in which the substrate 100 serves as a seed layer. The sacrificial layers 112 and the semiconductor layers 114 may be conformally grown on the entire surface of the substrate 100. The sacrificial layers 112 and the semiconductor layers 114 may be patterned to form an active pattern 110. The active pattern 110 may have a fin-shape.

A device isolation layer 120 may be formed on the substrate 100. The formation of the device isolation layer 120 may include forming an insulation layer on the entire surface of the substrate 100 and recessing the insulation layer until the active pattern 110 is fully exposed.

A sacrificial gate structure 130 may be formed to run across the active pattern 110. The sacrificial gate structure 130 may be formed to have a linear or bar shape extending in a second direction D2. The formation of the sacrificial gate structure 130 may include forming a sacrificial layer on the substrate 100, forming a first mask pattern M1 on the sacrificial layer, and using the first mask pattern M1 as an etching mask to etch the sacrificial layer.

Figure 19A:
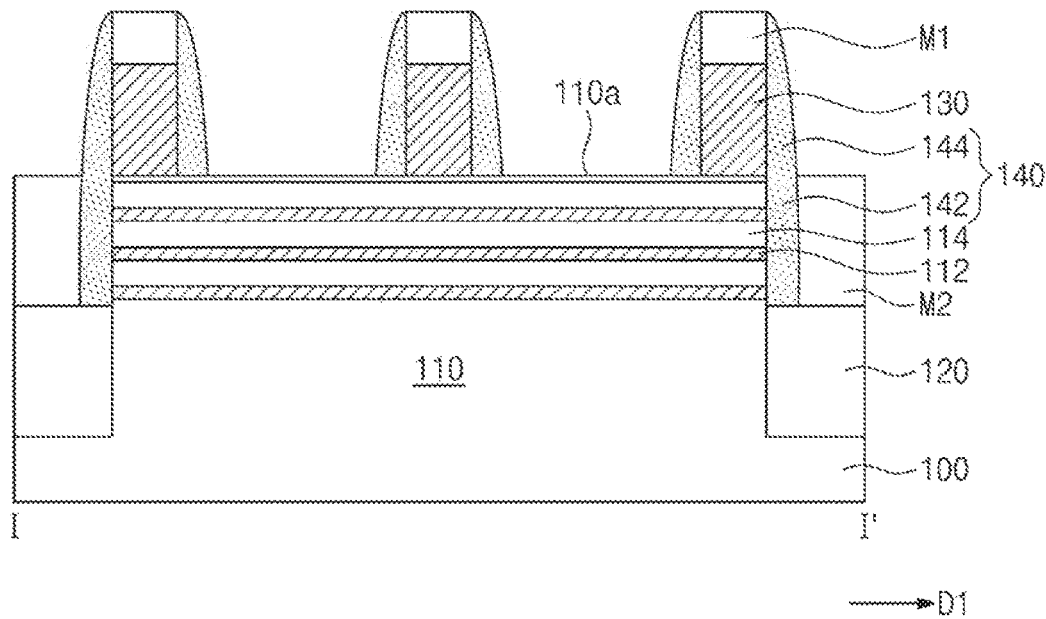
Figure 19B:
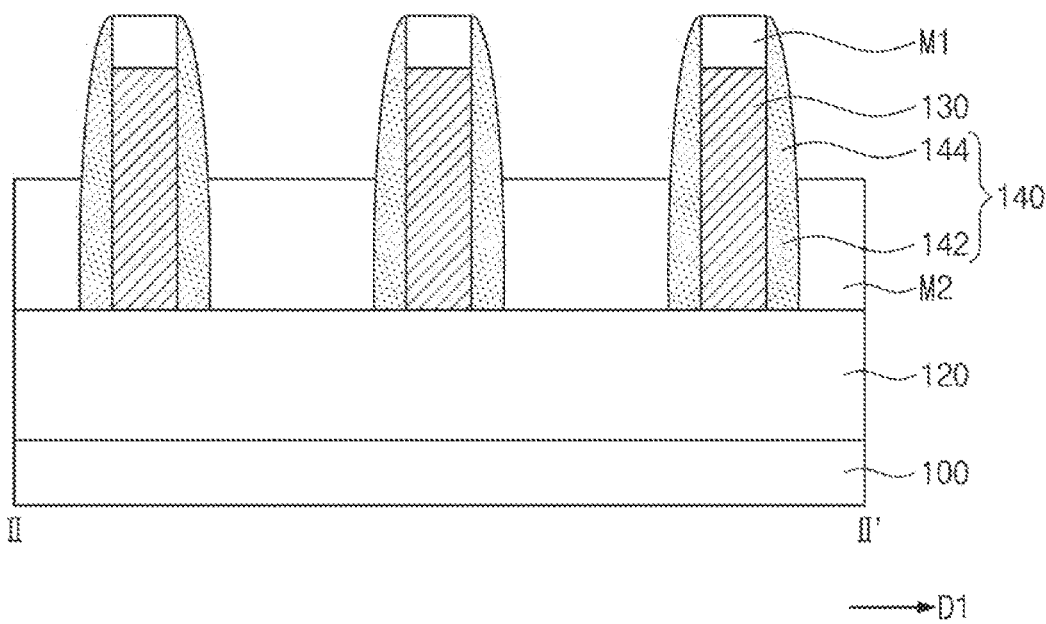

Referring to FIGS. 19A, and 19B, a first spacer 140 may be formed on opposite sidewalls of the sacrificial gate structure 130. The formation of the first spacer 140 may include performing a deposition process, such as chemical vapor deposition (CVD) or atomic layer deposition (ALD), to form a first spacer layer on the entire surface of the substrate 100, and performing an anisotropic etching process on the first spacer layer. The first spacer 140 may include an upper portion 144 at a higher level than a top surface 110a of the active pattern 110 and a lower portion 142 at a lower level than the top surface 110a of the active pattern 110.

A second mask pattern M2 may be formed on the substrate 100. The formation of the second mask pattern M2 may include forming a buried layer on the substrate 100 and etching the buried layer to partially remove portions of the buried layer that are located at a higher level than the top surface 110a of the active pattern 110. The second mask pattern M2 may have a top surface substantially coplanar with the top surface 110a of the active pattern 110.

Figure 20A:
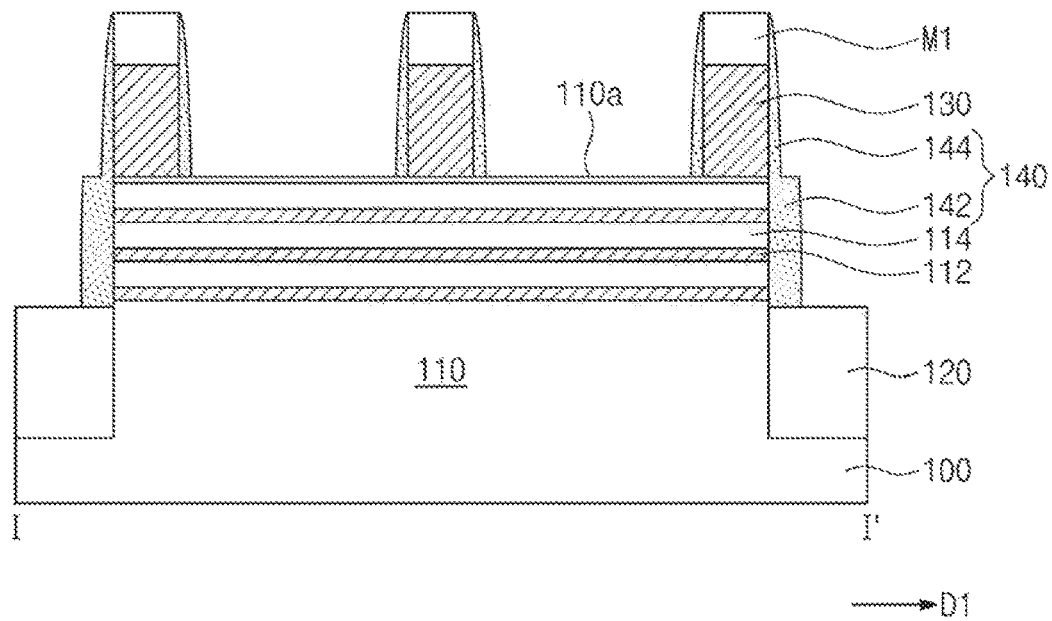
Figure 20B:
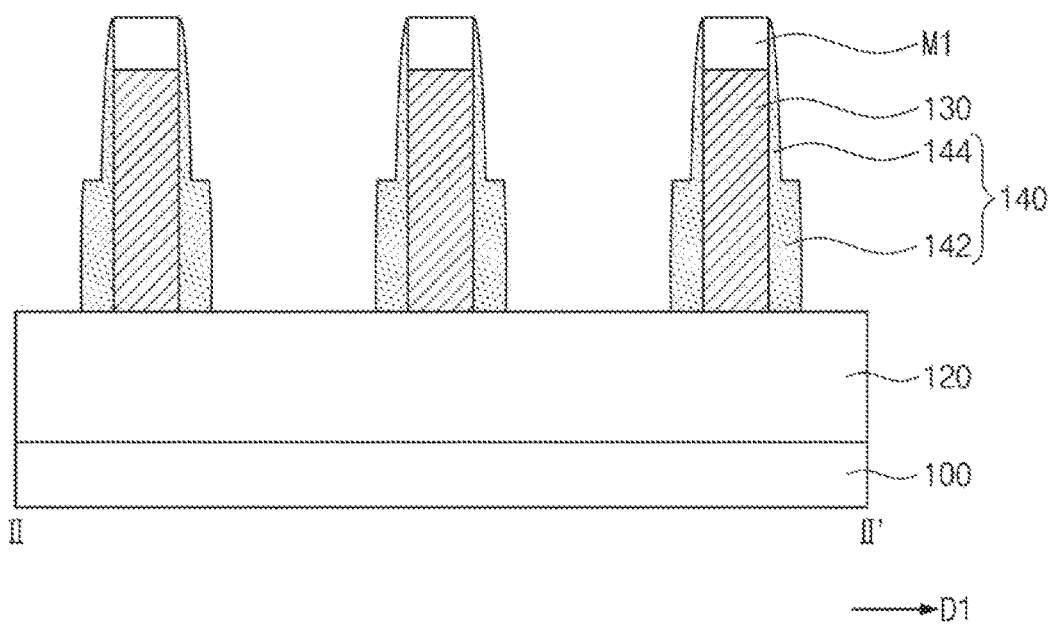

Referring to FIGS. 20A and 20B, the upper portion 144 of the first spacer 140 may be etched. An anisotropic etching process may be performed on the exposed upper portion 144 of the first spacer 140. The upper portion 144 of the first spacer 140 may accordingly have a small thickness. The second mask pattern M2 may be removed.

Identical to that discussed with reference to FIGS. 9A and 9B, the first mask pattern M1 and the first spacer 140 may be used as an etching mask to etch the active pattern 110, which etching may form a channel pattern 115. For example, the active pattern 110 may be etched to form recess regions R. Source/drain patterns 160 may be formed to fill the recess regions R. The formation of the source/drain patterns 160 may include performing a selective epitaxial growth process on the active pattern 110. A gate electrode 170 may be formed as discussed with reference to FIGS. 10 to 12 above.

A semiconductor device according to some embodiments of inventive concept may be formed to include the source/drain patterns protruding toward and below the sacrificial gate structure and also include the channel pattern having a small length, thereby decreasing in resistance of the channel pattern. Furthermore, the thick lower portion of the first spacer may reduce a parasitic capacitance between the gate electrodes adjacent to each other and/or between the gate electrode and the source/drain pattern.

According to some embodiments of the inventive concept, a semiconductor device is configured such that the gate electrode is provided on its upper portion with the second spacer having a low dielectric constant to reduce a leakage current originating from the upper portion of the gate electrode. Moreover, a parasitic capacitance may be reduced between the upper portion of the gate electrode and the source/drain pattern.

Although the present invention has been described in connection with the embodiments of inventive concept illustrated in the accompanying drawings, it will be understood by one of ordinary skill in the art that variations in form and detail may be made therein without departing from the spirit and essential feature of inventive concept. The above disclosed embodiments should thus be considered illustrative and not restrictive.

What is claimed is:

1. A semiconductor device, comprising:
    an active pattern protruding from a substrate and extending in a first direction;
    a gate electrode running across the active pattern in a second direction;
    a first spacer on a side surface of the gate electrode; and
    a second spacer on the side surface of the gate electrode and on the first spacer, having a side surface which is coplanar with a side surface of the first spacer,
    wherein a dielectric constant of the second spacer is less than a dielectric constant of the first spacer,
    wherein, on a boundary between the first spacer and the second spacer, a thickness of the second spacer is same or less than the thickness of the first spacer,
    wherein the first spacer comprises a first portion and a second portion on a substantially flat surface of the first portion, and
    wherein the substantially flat surface of the first portion is coplanar with an upper surface of the active pattern.

2. The device of claim 1, wherein a portion of the first spacer extends between the gate electrode and the second spacer.

3. The device of claim 1,
    wherein a thickness of the second portion is less than a thickness of the first portion.

4. The device of claim 3, wherein the first spacer having a stepped shape between the first portion and the second portion.

5. The device of claim 3, wherein, on a boundary between the first portion and the second portion, a sum of a thickness of the second spacer and the thickness of the second portion is same or less than the thickness of the first portion.

6. The device of claim 1, further comprises a source/drain pattern disposed adjacent to the side surface of the gate electrode.

7. The device of claim 6, wherein the substantially flat surface of the first portion is disposed at a level lower than an uppermost point of the source/drain pattern.

8. The device of claim 6, wherein the source/drain pattern is contact with a side surface of the first portion and a side surface of the second portion.

9. The device of claim 1,
    wherein the active pattern comprises semiconductor patterns sequentially stacked on the substrate; and
    wherein the gate electrode comprises a first metal pattern between the semiconductor patterns and a second metal pattern on the first metal pattern, the first metal pattern filling a gap between the semiconductor patterns.

10. The device of claim 6, wherein a bottommost point of the source/drain pattern is below a bottommost point of the second portion.

11. The device of claim 1, wherein the first spacer and the second spacer cover a planar surface of the active pattern perpendicular to the first direction.

* * * * *